(12) United States Patent
Yu et al.

(10) Patent No.: US 12,733,186 B2
(45) **Date of Patent: *Sep. 8, 2026**

(54) METAL-INSULATOR-METAL CAPACITORS AND METHODS OF FORMING THE SAME

(71) Applicant: Taiwan Semiconductor Manufacturing Company, Ltd., Hsin-Chu (TW)

(72) Inventors: Li Chung Yu, Kaohsiung City (TW); Shin-Hung Tsai, Hsinchu City (TW); Cheng-Hao Hou, Hsinchu City (TW); Hsiang-Ku Shen, Hsinchu City (TW); Chen-Chiu Huang, Taichung City (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 554 days.

This patent is subject to a terminal disclaimer.

(21) Appl. No.: 18/188,196

(22) Filed: Mar. 22, 2023

(65) Prior Publication Data

US 2024/0088204 A1 Mar. 14, 2024

Related U.S. Application Data

(60) Provisional application No. 63/386,789, filed on Dec. 9, 2022, provisional application No. 63/404,653, filed on Sep. 8, 2022.

(51) Int. Cl.
*H10D 1/68* (2025.01)

(52) U.S. Cl.
CPC .................................. *H10D 1/692* (2025.01)

(58) Field of Classification Search
CPC ................................ H10D 1/692; H10D 1/68
(Continued)

(56) References Cited

U.S. PATENT DOCUMENTS

2004/0140527 A1* 7/2004 Furuya .................. H10D 1/047 257/532
2005/0260357 A1* 11/2005 Olsen ................ H01L 21/02178 257/E21.267

(Continued)

FOREIGN PATENT DOCUMENTS

| | | | |
|---|---|---|---|
| CN | 108962879 | A | 12/2018 |
| CN | 113594365 | A | 11/2021 |
| TW | 202141635 | A | 11/2021 |

OTHER PUBLICATIONS

Huang et al., "Resistor Structure," U.S. Appl. No. 17/460,564, filed Aug. 30, 2021, Assignee: Taiwan Semiconductor Manufacturing Company, Ltd., 31 pages specification, 36 pages drawings.

*Primary Examiner* — Duy T Nguyen
(74) *Attorney, Agent, or Firm* — HAYNES AND BOONE, LLP

(57) ABSTRACT

Semiconductor structures and methods are provided. An exemplary method includes depositing a first conductive material layer over a substrate, patterning the first conductive material layer to form a first conductor plate over the substrate, forming a first high-K dielectric layer over the first conductor plate, forming a second high-K dielectric layer on the first high-K dielectric layer, forming a third high-K dielectric layer on the second high-K dielectric layer, and forming a second conductor plate over the third high-K dielectric layer and vertically overlapped with the first conductor plate, where a composition of the first high-K dielectric layer is the same as a composition of the third high-K dielectric layer and is different from a composition of the second high-K dielectric layer.

20 Claims, 20 Drawing Sheets

(58) Field of Classification Search
USPC .......................................................... 438/381
See application file for complete search history.

(56) References Cited

U.S. PATENT DOCUMENTS

| | | | | |
|---|---|---|---|---|
| 2014/0061855 | A1* | 3/2014 | Kuo | H01L 23/5223 257/532 |
| 2015/0311273 | A1 | 10/2015 | Lin | |
| 2019/0221515 | A1 | 7/2019 | Gu | |
| 2021/0343831 | A1* | 11/2021 | Hu | H01L 21/76834 |
| 2021/0359082 | A1* | 11/2021 | Kang | H10B 53/30 |
| 2023/0395647 | A1* | 12/2023 | Lin | H10D 1/042 |

* cited by examiner

264''
264
264d
264c
264b
264a
266
267
262'
263'

264'
264d
264a'
266
267
262'
263'
T4
T
T'

264
264c
264b
264a
266
267
262'
263'

METAL-INSULATOR-METAL CAPACITORS AND METHODS OF FORMING THE SAME

PRIORITY DATA

This application claims priority to U.S. Provisional Patent Application Ser. No. 63/404,653 filed Sep. 8, 2022, and U.S. Provisional Patent Application Ser. No. 63/386,789 filed Dec. 9, 2022, each of which are hereby incorporated herein by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-insulator-metal (MIM) capacitors are among examples of such passive devices. A typical MIM capacitor includes multiple conductor plates that are insulated from one another by multiple insulator layers. Although existing MIM capacitors and the fabrication processes thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
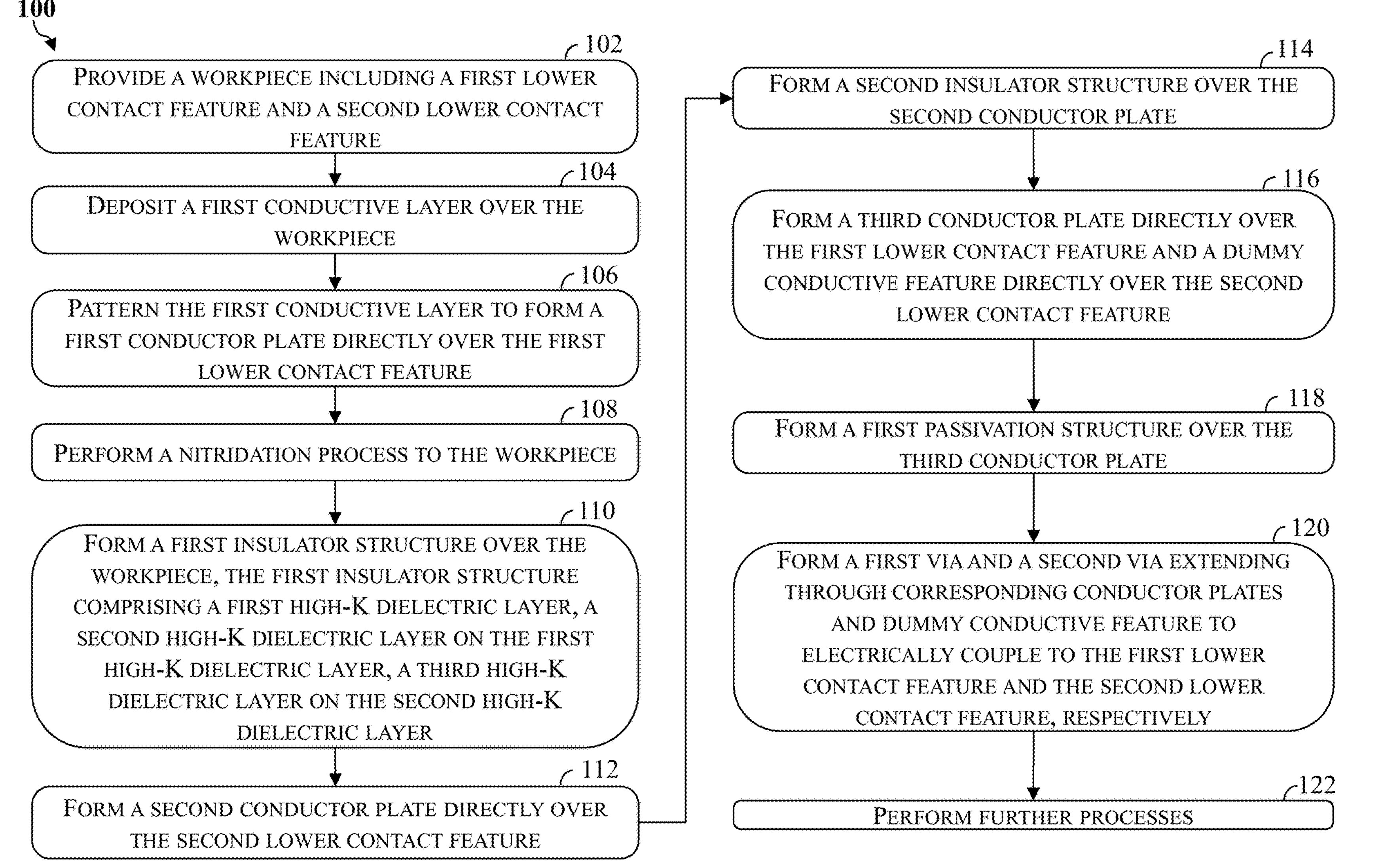
FIG. 1 is a flow chart of a method for fabricating a semiconductor structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-insulator-metal (MIM) capacitors have been widely used in functional circuits such as mixed signal circuits, analog circuits, Radio Frequency (RF) circuits, Dynamic Random-Access Memories (DRAMs), and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes multiple conductor plates, each of which is insulated from an adjacent conductor plate by an insulator layer. Nowadays, MIM capacitors are also implemented in high-performance computing (HPC). Those MIM capacitors implemented in HPC may need high capacitances. Although existing MIM capacitors may be satisfactory in providing high capacitances, they may have short lifetime since the insulator layer disposed between two adjacent conductor plates undergo time-dependence-dielectric-breakdown (TDDB) failure.

The present disclosure provides metal-insulator-metal (MIM) capacitors having improved TDDB performance and methods of forming the same. A metal-insulator-metal (MIM) capacitor includes a multi-layer insulator structure disposed between two adjacent conductor plates. In an exemplary embodiment, a method of forming the MIM capacitor includes depositing a first conductive layer over a substrate, performing an etching process to pattern the first conductive layer to form a first conductor plate, performing a nitridation process to the first conductor plate, forming a first hafnium-zirconium oxide (HZO) layer over the first conductor plate, forming a titanium oxide layer or an aluminum oxide layer on the first hafnium-zirconium oxide (HZO) layer, and then forming a second hafnium-zirconium oxide (HZO) layer on the titanium oxide layer or the aluminum oxide layer. By inserting the titanium oxide layer or the aluminum oxide layer between the first and second hafnium-zirconium oxide layers, defects in the first and second hafnium-zirconium oxide layers may be less easily linked. As such, conducting paths along the grain boundary of the first and second hafnium-zirconium oxide layers may be reduced or eliminated. Thus, TDDB performance of the MIM capacitor is advantageously improved.

The various aspects of the present disclosure will now be described in more detail with reference to the figures. In that regard, FIG. 1 is a flowchart illustrating a method 100 for fabricating a semiconductor structure, according to embodiments of the present disclosure. Method 100 is described below in conjunction with FIGS. 2-18, which are fragmentary cross-sectional views of a workpiece 200 at different stages of fabrication according to embodiments of method 100. FIG. 19 is a flowchart illustrating a method 300 for fabricating a semiconductor structure, according to embodiments of the present disclosure. Method 300 is described below in conjunction with FIGS. 1-18 and 20-24, FIGS. 2-24 are fragmentary cross-sectional views of a workpiece 200' at different stages of fabrication according to embodiments of method 300. Because the workpiece 200/200' will be fabricated into a semiconductor structure at the conclusion of the fabrication processes, the workpiece may also be referred to as a semiconductor structure 200/200', as the context requires. Methods 100 and 300 are merely examples and are not intended to limit the present disclosure to what is explicitly illustrated therein. Additional steps can be provided before, during, and after method 100/300, and some steps described can be replaced, eliminated, or moved around for additional embodiments of the method. Not all steps are described herein in detail for reasons of simplicity. Additionally, throughout the present application, like reference numerals denote like features, unless otherwise excepted.

Figure 2:
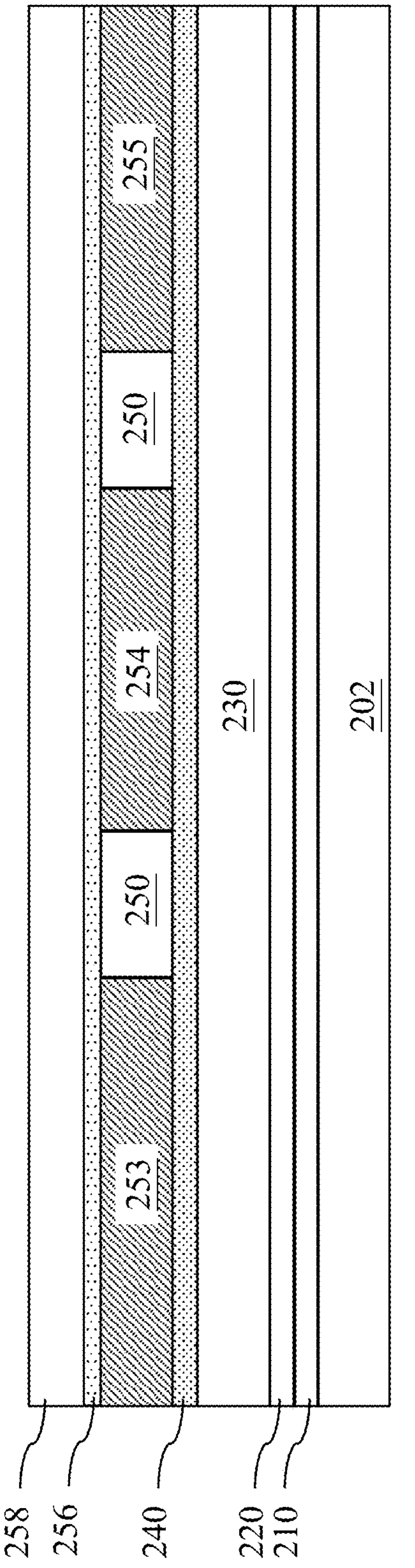
FIGS. 2, 3, 4, 5, 6, 7, 8, 9, 10, 11, 12, 13, 14, 15, and 16 are fragmentary cross-sectional views of a workpiece during various fabrication stages in the method of FIG. 1, according to various aspects of the present disclosure.

Referring to FIGS. 1 and 2, method 100 includes a block 102 where a workpiece 200 is provided. The workpiece 200 includes a substrate 202, which may be made of silicon or other semiconductor materials such as germanium. The substrate 202 may also include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, such as an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Source/drain feature (s) may refer to a source or a drain, individually or collectively dependent upon the context. Transistors formed on the substrate 202 may be planar devices or multi-gate devices. Multi-gate devices include, for example, fin-like field effect transistors (FinFETs) or multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The workpiece 200 also includes a multi-layer interconnect (MLI) structure 210, which provides interconnections (e.g., wiring) between the various microelectronic components of the workpiece 200. The MLI structure 210 may also be referred to as an interconnect structure 210. The MLI structure 210 may include multiple metal layers or metallization layers. In some instances, the MLI structure 210 may include eight (8) to fourteen (14) metal layers. Each of the metal layers includes multiple conductive components embedded in an intermetal dielectric (IMD) layer. The conductive components may include contacts, vias, or metal lines. The IMD layer may be a silicon oxide or silicon-oxide-containing material where silicon exists in various suitable forms. As an example, the IMD layer includes silicon oxide or a low-k dielectric material having k-value (dielectric constant) smaller than that of silicon oxide, which is about 3.9. In some embodiments, the low-k dielectric material includes tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbonitride (SiOCN), spin-on silicon based polymeric dielectrics, combinations thereof, or other suitable materials.

In an embodiment, a carbide layer 220 is deposited on the MLI structure 210. The deposition process includes chemical vapor deposition (CVD), physical vapor deposition (PVD), atomic layer deposition (ALD), or combinations thereof. Any suitable type of carbide material such as silicon carbide (SiC) can be used in the carbide layer 220.

In an embodiment, an oxide layer 230 is deposited on the carbide layer 220. Any suitable deposition process for the oxide layer 230 may be used, including CVD, flowable CVD (FCVD), spin-on coating, PVD, ALD, or combinations thereof. In an embodiment, the oxide layer 230 includes undoped silicon oxide.

The workpiece 200 also includes a first etch stop layer (ESL) 240 deposited on the oxide layer 230. The first ESL 240 may include silicon carbonitride (SiCN), silicon oxycarbide (SiOC), silicon carbide (SiC), silicon oxycarbonitride (SiOCN), or silicon nitride (SiN), or combinations thereof and may be formed by chemical vapor deposition (CVD), physical vapor deposition (PVD), atomic layer deposition (ALD), or combinations thereof.

The workpiece 200 also includes a dielectric layer 250 deposited on the first ESL 240. A composition of the dielectric layer 250 may be similar to that of the oxide layer 230. In some embodiments, the dielectric layer 250 includes undoped silica glass (USG) or silicon oxide. The dielectric layer 250 may be deposited using CVD, flowable CVD (FCVD), spin-on coating, PVD, ALD, or combinations thereof.

The workpiece 200 also includes a number of lower contact features (e.g., a lower contact feature 253, a lower contact feature 254, and a lower contact feature 255) formed in the dielectric layer 250. The formation of the lower contact features may include patterning of the dielectric layer 250 to form trenches and deposition of a barrier layer (not separately labeled) and a metal fill layer (not separately labeled) in the trenches. In some embodiments, the barrier layer may include titanium nitride or tantalum nitride and may be conformally deposited using PVD, CVD, metal organic CVD (MOCVD), or a suitable method. In one embodiment, the barrier layer may include tantalum nitride. The metal fill layer may include copper (Cu) and may be deposited using electroplating or electroless plating. After the barrier layer and the metal fill layer are deposited, a planarization process, such as a chemical mechanical planarization (CMP) process, may be performed to remove excess barrier layer and metal fill layer to form the lower contact features 253, 254 and 255. Although the lower contact features 253, 254, and 255 are disposed below upper contact features (such as upper contact features 292, 294), the lower contact features 253, 254, and 255 are sometimes referred to as top metal (TM) contacts.

The workpiece 200 also includes a second etch stop layer 256 formed directly on the dielectric layer 250. In an embodiment, the second etch stop layer 256 is deposited on the dielectric layer 250 by chemical vapor deposition (CVD), physical vapor deposition (PVD), atomic layer deposition (ALD), or combinations thereof. The second etch stop layer 256 may include silicon carbonitride (SiCN), silicon nitride (SiN), other suitable materials, or combinations thereof. In the present embodiments, the second etch stop layer 256 is in direct contact with top surfaces of the lower contact features 253, 254, and 255.

The workpiece 200 also includes an oxide layer 258 formed directly on the second etch stop layer 256. In an embodiment, the oxide layer 258 may include undoped silica glass (USG), silicon oxide, or other suitable material(s).

Figure 3:
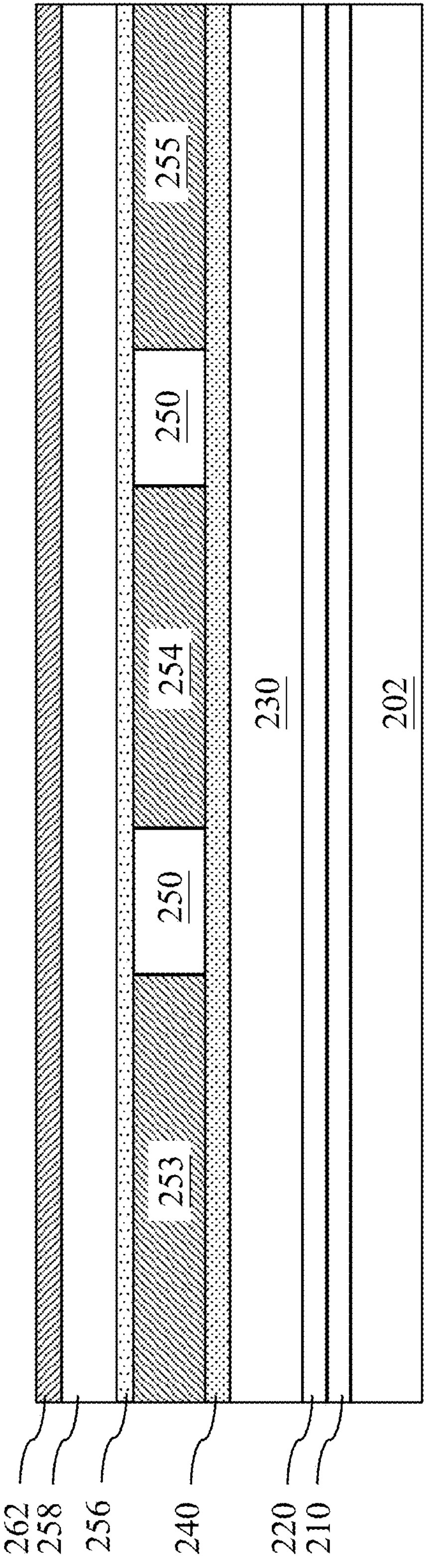

Referring to FIGS. 1 and 3, method 100 includes a block 104 where a first conductive layer 262 is formed directly on the oxide layer 258. The first conductive layer 262 may be deposited on the oxide layer 258 using PVD, CVD, or MOCVD and may cover an entire top surface of the workpiece 200. In some embodiments, the first conductive layer 262 may include titanium (Ti), tantalum (Ta), titanium nitride (TiN), tantalum nitride (TaN), copper (Cu), cobalt (Co), nickel (Ni), tungsten (W), aluminum (Al), or other suitable materials. In an embodiment, the first conductive layer 262 includes titanium nitride (TiN).

Figure 4:
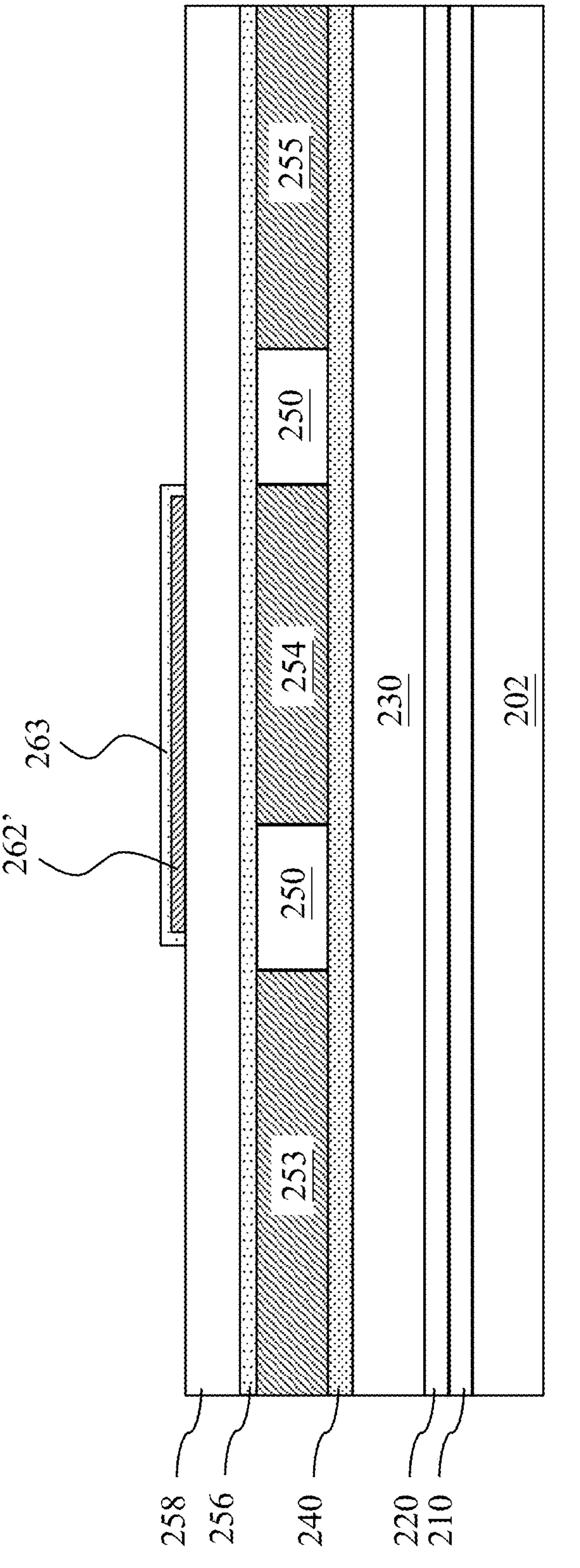

Referring to FIGS. 1 and 4, method 100 includes a block 106 where the first conductive layer 262 is patterned to form a first conductor plate 262' directly over the lower contact feature 254. The patterning may include deposition of a hard mask layer over the first conductive layer 262, formation of a photoresist layer over the hard mask layer, patterning of the photoresist layer using photolithography, etching of the hard mask layer using the patterned photoresist layer as an etch mask, and then etching of the first conductive layer 262 using the patterned hard mask as an etch mask. The hard mask layer and the photoresist layer may be selectively removed. In the present embodiments, the etching of the first conductive layer 262 of and/or the removal of the hard mask layer and the photoresist layer forms an oxide layer 263. That is, top surface and sidewall surfaces of the first conductor plate exposed to the etchant(s) are oxidized, thereby forming the oxide layer 263. As depicted in FIG. 4, the oxide layer 263 extends along the top and sidewall surfaces of the first conductor plate 262'. In embodiments that the first conductive layer 262 includes titanium nitride (TiN), the oxide layer 263 includes titanium oxide ($TiO_2$).

Figure 5:
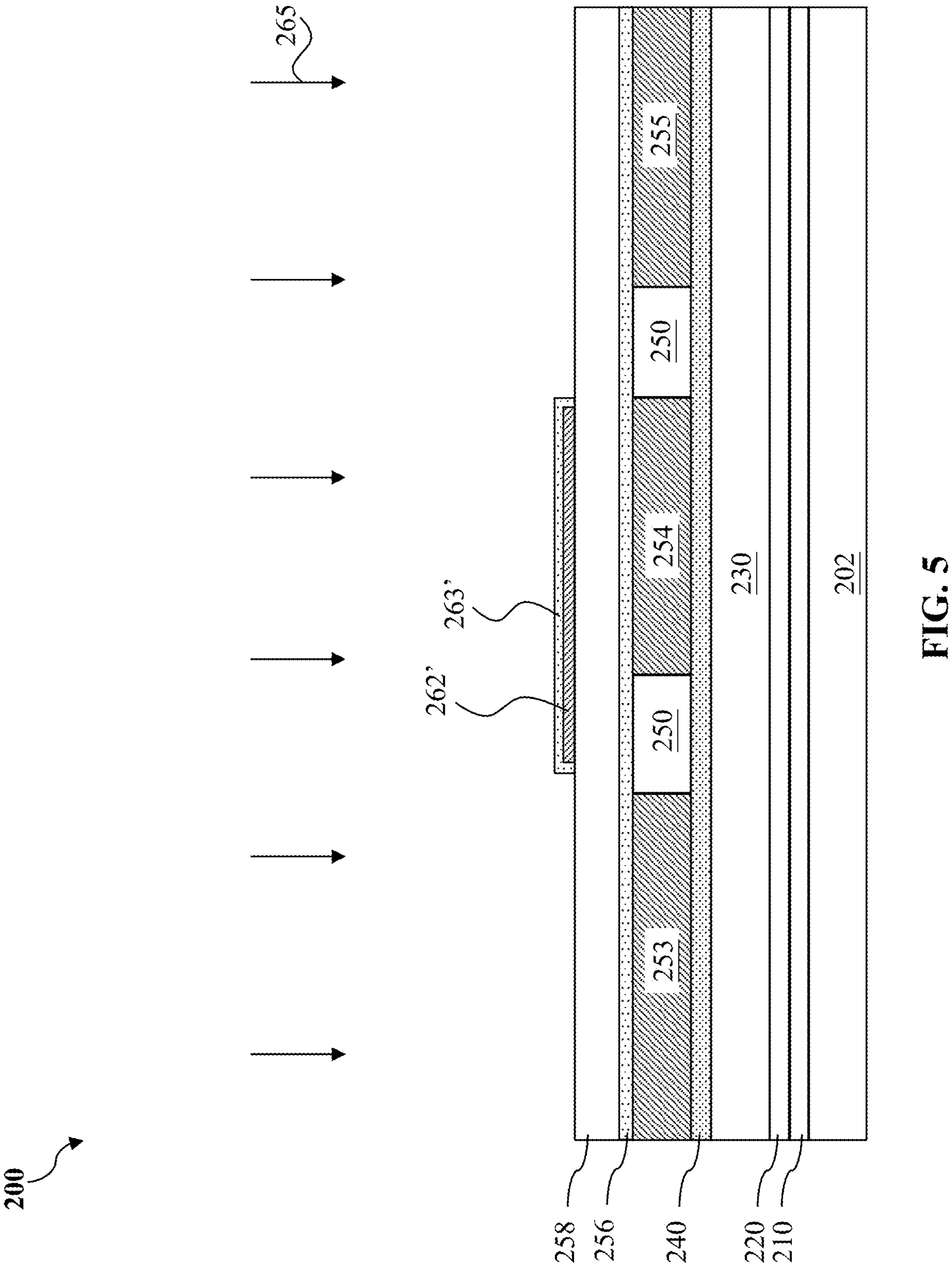

Referring to FIGS. 1 and 5, method 100 includes a block 108 where a nitridation process 265 is performed to the workpiece 200 to convert the oxide layer 263 into a nitridated oxide layer 263', thereby improving the quality at the interface between the first conductor plate 262' and the to-be-formed first insulator structure 264 (shown in FIG. 6) and improving reliability of a final structure of the workpiece 200. In an embodiment, the nitrogen source in the nitridation process 265 includes nitrogen plasma. The nitridation process 265 may be performed at a flow of about 8000 sccm to about 10000 sccm, at a temperature between about 350° C. and about 450° C., and under a plasma power of about 200 W to about 300 W for a duration of about 20 seconds to 60 seconds to form satisfactory nitridated layer (e.g., the nitridated oxide layer 263') without damaging front-end devices (e.g., transistors formed on the substrate 202). After performing the nitridation process 265, the oxide layer 263 is nitridated and becomes the nitridated oxide layer 263'. In an embodiment, the oxide layer 263 includes titanium oxide ($TiO_2$), and the nitridated oxide layer 263' includes titanium oxynitride (TiON). After the performing of the nitridation process 265, the nitrogen content in the first conductor plate 262' may also change. In an embodiment, an upper portion of the first conductor plate 262' has a higher nitrogen content than a nitrogen content of a lower portion of the first conductor plate 262'. That is, the upper portion of the first conductor plate 262' includes nitrogen-rich titanium nitride (TiN) and the lower portion of the first conductor plate 262' may be nitrogen poor.

Figure 6:
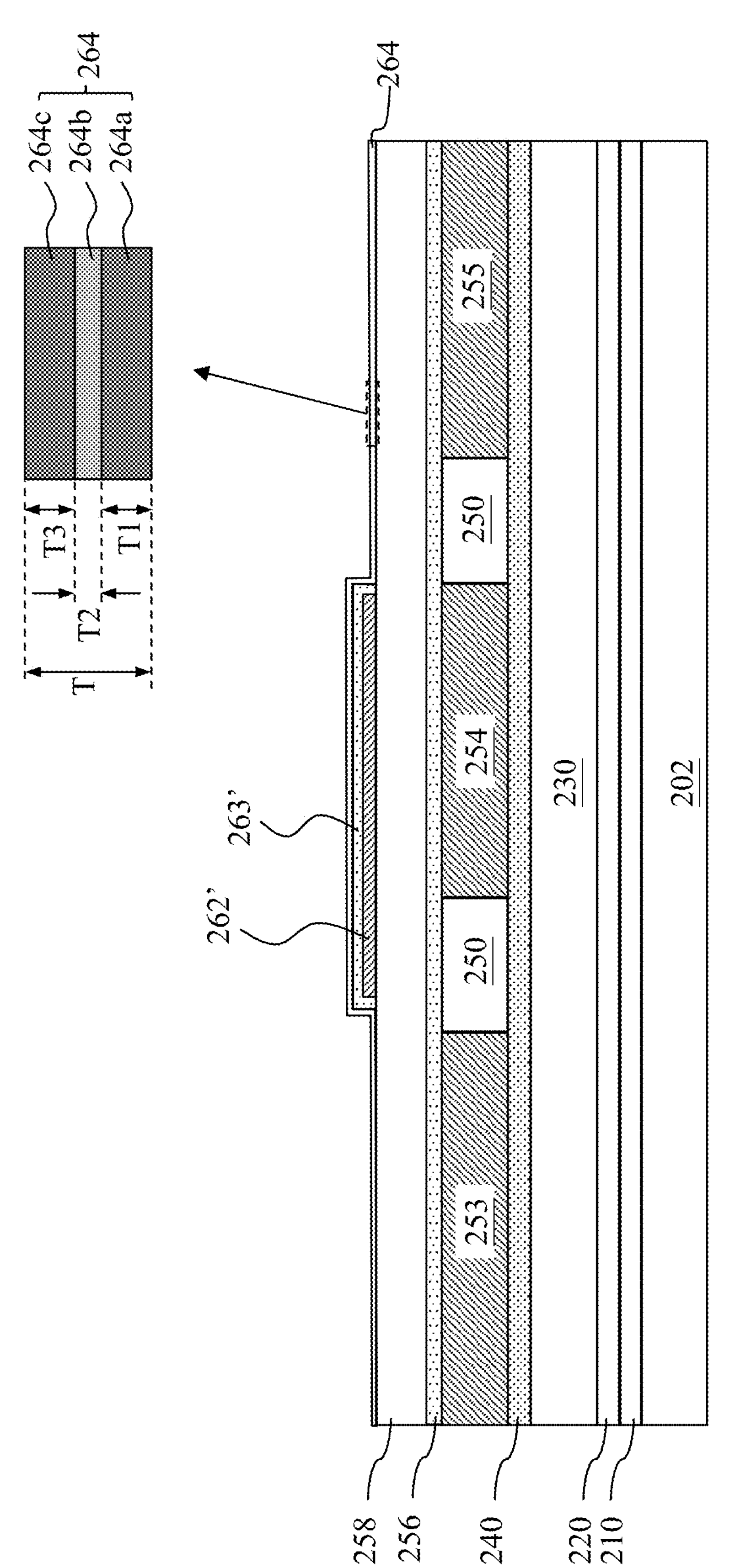

Referring to FIGS. 1 and 6, method 100 includes a block 110 where a first insulator structure 264 is formed over the workpiece 200. After the first conductive layer 262 is patterned to form the first conductor plate 262' and after the performing of the nitridation process 265, the first insulator structure 264 is formed. The first insulator structure 264 is conformally formed to have a generally uniform thickness over the top surface of the workpiece 200 (e.g., having about the same thickness on top and sidewall surfaces of the nitridated oxide layer 263').

In the present embodiments, to improve the time-dependence-dielectric-breakdown (TDDB) performance and thus improve the reliability of the semiconductor devices (e.g., metal-insulator-metal capacitor), the first insulator structure 264 is a multi-layer structure and includes a conformal first high-K dielectric layer 264*a* formed directly on the oxide layer 258 and the nitridated oxide layer 263', a conformal second high-K dielectric layer 264*b* formed directly on the first high-K dielectric layer 264*a*, and a conformal third high-K dielectric layer 264*c* formed directly on the second high-K dielectric layer 264*b*. In an embodiment, the first high-K dielectric layer 264*a*, the second high-K dielectric layer 264*b*, and the third high-K dielectric layer 264*c* are deposited using thermal atomic layer deposition (ALD) implementing halide precursors at a temperature between about 200° C. and about 400° C. The temperature of the thermal ALD may be less than the temperature of the nitridation process 265. The conformal first high-K dielectric layer 264*a* is in direct contact with the nitridated oxide layer 263' and the oxide layer 258, and is spaced apart from the first conductor plate 262' by the nitridated oxide layer 263'.

The first insulator structure 264 has a total thickness T, and, in an embodiment, a composition of the first high-K dielectric layer 264*a* is the same as a composition of the third high-K dielectric layer 264*c*. Compared to embodiments where the insulator structure is a single-layer structure and is formed of the first high-K dielectric layer having the thickness T, forming the first high-K dielectric layer 264*a* having a thickness T1 less than the thickness T and the third high-K dielectric layer 264*c* having a thickness T3 less than the thickness T would advantageously reduce or block the crystallization of the first high-K dielectric layer 264*a* and the third high-K dielectric layer 264*c*, thereby reducing the formation of conducting paths in the first and third high-K dielectric layers and improving TDDB performance. In an embodiment, the first high-K dielectric layer 264*a* and the third high-K dielectric layer 264*c* include hafnium-zirconium oxide (HZO). To provide satisfactory forward bias related TDDB and satisfactory reverse bias related TDDB, a ratio of the thickness T1 to the thickness T3 may be between about 0.9 and about 1.1. In an embodiment, the thickness T1 is substantially equal to the thickness T3. In some embodiments, each of the thickness T1 and the thickness T3 is greater than 0 Å and is less than 60 Å.

The first insulator structure 264 also includes the second high-K dielectric layer 264*b* sandwiched by the first high-K dielectric layer 264*a* and the third high-K dielectric layer 264*c*. In an embodiment, the dielectric constant of the second high-K dielectric layer 264*b* is less than the dielectric constant of the first high-K dielectric layer 264*a* and the third high-K dielectric layer 264*c*. By forming the second high-K dielectric layer 264*b* between the first high-K dielectric layer 264*a* and the third high-K dielectric layer 264*c*, defects in the first high-K dielectric layer 264*a* and the third high-K dielectric layer 264*c* may be less easily linked to form conducting paths along the grain boundary of the first and third high-K dielectric layers, thus TDDB performance may be improved. A lattice constant of the second high-K dielectric layer 264*b* is different from a lattice constant of the first high-K dielectric layer 264*a* and the third high-K dielectric layer 264*c*. In embodiments where the first high-K dielectric layer 264*a* and the third high-K dielectric layer 264*c* includes HZO, to significantly improve the TDDB performance and save fabrication cost, the second high-K dielectric layer 264*b* includes aluminum oxide ($Al_2O_3$). In another embodiment, the second high-K dielectric layer 264*b* includes titanium oxide ($TiO_2$). A thickness T2 of the second high-K dielectric layer 264*b* is less than the thickness T1. In an embodiment, a ratio of the thickness T1 to the thickness T2 may be greater than 10. The thickness T2 of the second high-K dielectric layer 264*b* is greater than 0 Å and less than 10 Å.

Figure 7:
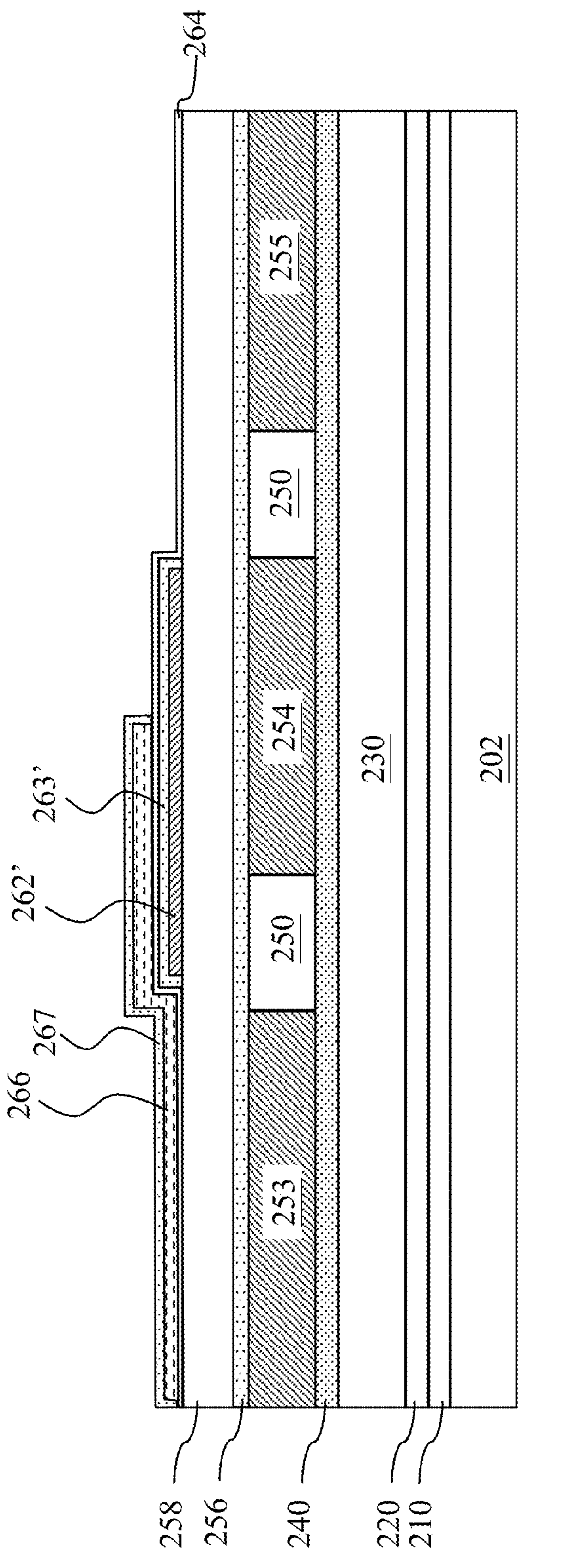

Referring to FIGS. 1 and 7, method 100 includes a block 112 where a second conductor plate 266 is formed on the first insulator structure 264. In the present embodiments, the second conductor plate 266 is formed directly over the lower contact feature 253 and vertically overlapped with the first conductor plate 262'. The composition and formation of the second conductor plate 266 may be similar to the formation of the first conductor plate 262'. For example, a second conductive layer may be deposited over the workpiece 200 and then patterned to form the second conductor plate 266. In an embodiment, the second conductor plate 266 includes titanium nitride (TiN). In some embodiments, top and sidewall surfaces of the second conductor plate 266 may be oxidized, and the workpiece 200 may thus include titanium oxide formed on the second conductor plate 266. The oxidized layer may be then nitrated by a nitridation process that is similar to the nitridation process 265 to form a nitridated oxide layer 267 (e.g., TiON). In addition, an upper portion of the second conductor plate 266 has a higher nitrogen content than a nitrogen content of a lower portion of the second conductor plate 266.

Figure 8:
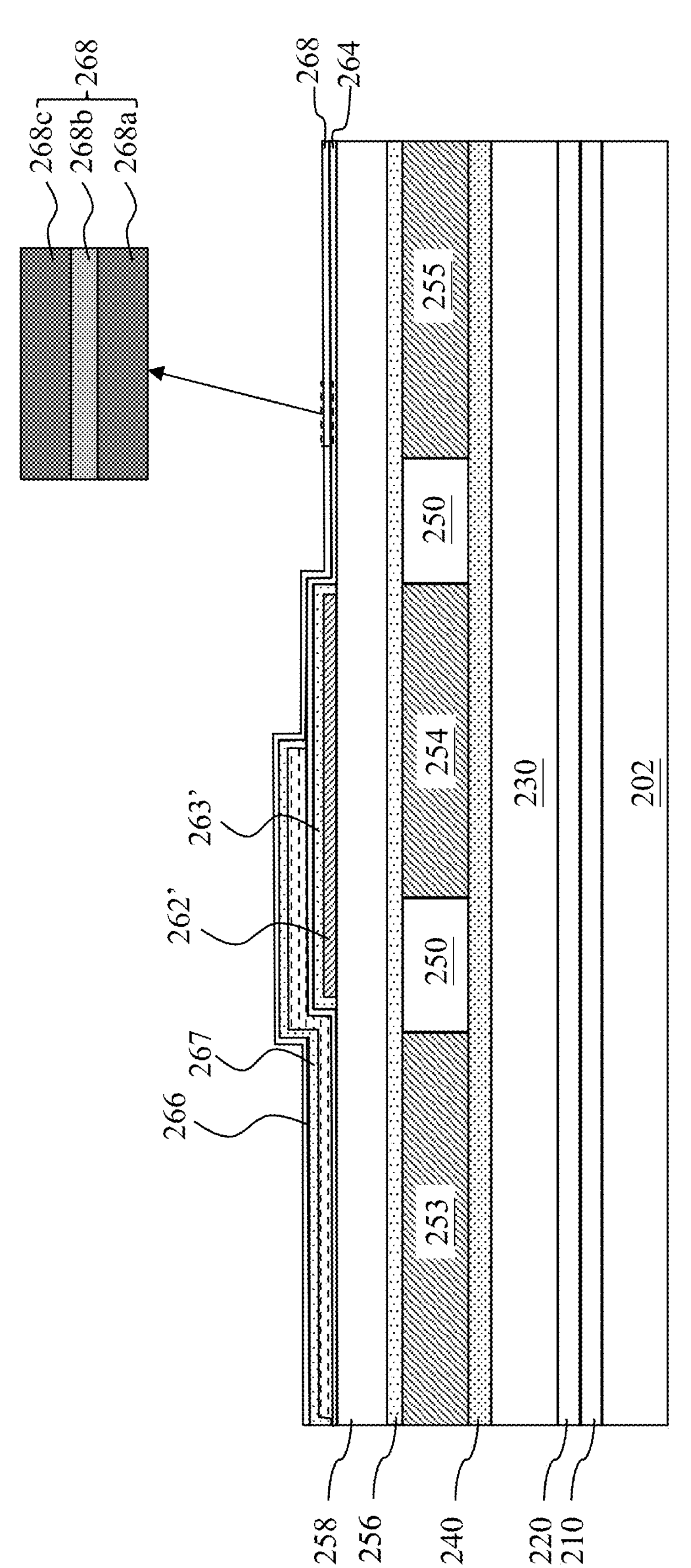

Referring to FIGS. 1 and 8, method 100 includes a block 114 where a second insulator structure 268 is formed over the workpiece 200. In an embodiment, the second insulator structure 268 is conformally formed to have a generally uniform thickness over the top surface of the workpiece 200 (e.g., having about the same thickness over top and sidewall surfaces of the nitridated oxide layer). In an embodiment, the formation and composition of the second insulator structure 268 is similar to those of the first insulator structure 264. For example, the second insulator structure 268 includes a first high-K dielectric layer 268*a*, a second high-K dielectric layer 268*b*, and a third high-K dielectric layer 268*c*. In an embodiment, the formation, composition, and thickness of the first high-K dielectric layer 268*a* are the same as those of the first high-K dielectric layer 264*a*, the formation, composition, and thickness of the second high-K dielectric layer 268*b* are the same as those of the second high-K dielectric layer 264*b*, and the formation, composition, and thickness of the third high-K dielectric layer 268*c* are the same as those of the third high-K dielectric layer 264*c*, and repeated description is omitted for reason of simplicity. Thus, the TDDB performance of the second insulator structure 268 disposed between the second conductor plate 266 and the third conductor plate 270*a* may be improved.

Figure 9:
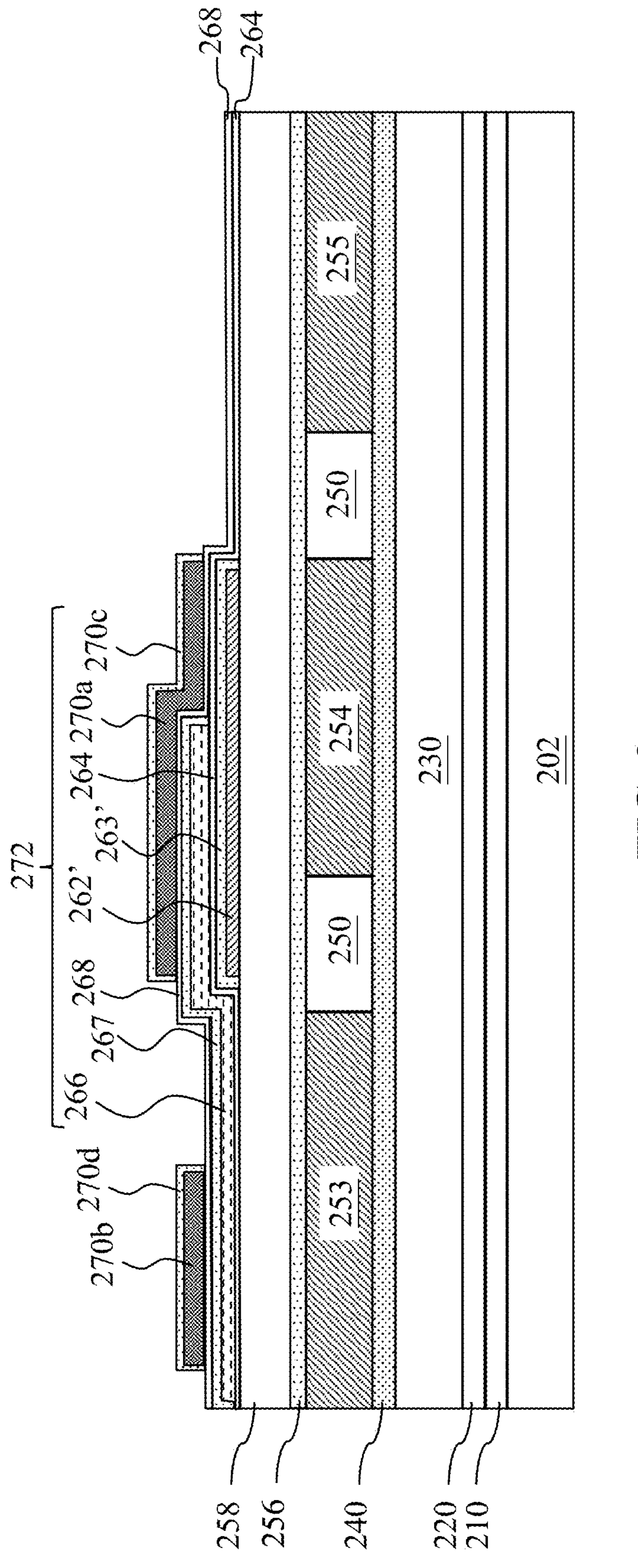

Referring to FIGS. 1 and 9, method 100 includes a block 116 where a third conductor plate 270*a* and a dummy conductive feature 270*b* are formed on the second insulator structure 268. More specifically, the third conductor plate 270*a* is formed directly over the lower contact feature 254 and vertically overlapped with both the first conductor plate 262' and the second conductor plate 266, and the dummy conductive feature 270*b* is formed directly over the lower contact feature 253 and vertically overlapped with the second conductor plate 266. The formation and composition of the third conductor plate 270*a* and the dummy conductive feature 270b may be similar to those of the first conductor plate 262', and repeated description is omitted for reason of simplicity. In an embodiment, the third conductor plate 270*a* and the dummy conductive feature 270*b* includes titanium nitride (TiN). A nitridation process similar to the nitridation process 265 may be performed. Similarly, the workpiece 200 also includes a nitridated oxide layer 270*c* formed on sidewall and top surfaces of the third conductor plate 270*a* and a nitridated oxide layer 270*d* formed on sidewall and top surfaces of the dummy conductive feature 270*b*. In an embodiment, the nitridated oxide layer 270*c* and the nitridated oxide layer 270*d* include titanium oxynitride (TION). An upper portion of the third conductor plate 270*a* has a higher nitrogen content than a nitrogen content of a lower portion of the third conductor plate 270*a*, and an upper portion of the dummy conductive feature 270*b* has a higher nitrogen content than a nitrogen content of a lower portion of the dummy conductive feature 270*b*.

After the formation of the third conductor plate 270*a*, the structure of a MIM capacitor 272 is finalized. In embodiments represented in FIG. 9, the workpiece 200 includes the MIM capacitor 272 and the dummy conductive feature 270*b* formed directly over the lower contact feature 253. In the present embodiments, the MIM capacitor 272 includes three vertically stacked conductor plates (i.e., the first conductor plate 262', the second conductor plate 266, and the third conductor plate 270*a*) and multiple insulator structures (i.e., the first insulator structure 264, the second insulator structure 268) and multiple nitridated oxide layers (e.g., the layers 263', 267, 270*c*). It is understood that the MIM capacitor 272 may include other suitable number of conductor plates (e.g., two, four or more), and each two adjacent conductor plates are isolated by a corresponding multi-layer insulator structure (e.g., the multi-layer first insulator structure 264) and a nitridated oxide layer (e.g., the nitridated oxide layer 263'). In an embodiment, the first and third high-K dielectric layers (e.g., 264*a* and 264*c*, 268*a* and 268*c*) include HZO, and the second high-K dielectric layer (e.g., 264*b*, 268*b*) includes aluminum oxide ($Al_2O_3$). In another embodiment, the first and third high-K dielectric layers (e.g., 264*a* and 264*c*, 268*a* and 268*c*) include HZO, and the second high-K dielectric layer (e.g., 264*b*, 268*b*) includes titanium oxide ($TiO_2$).

Figure 10:
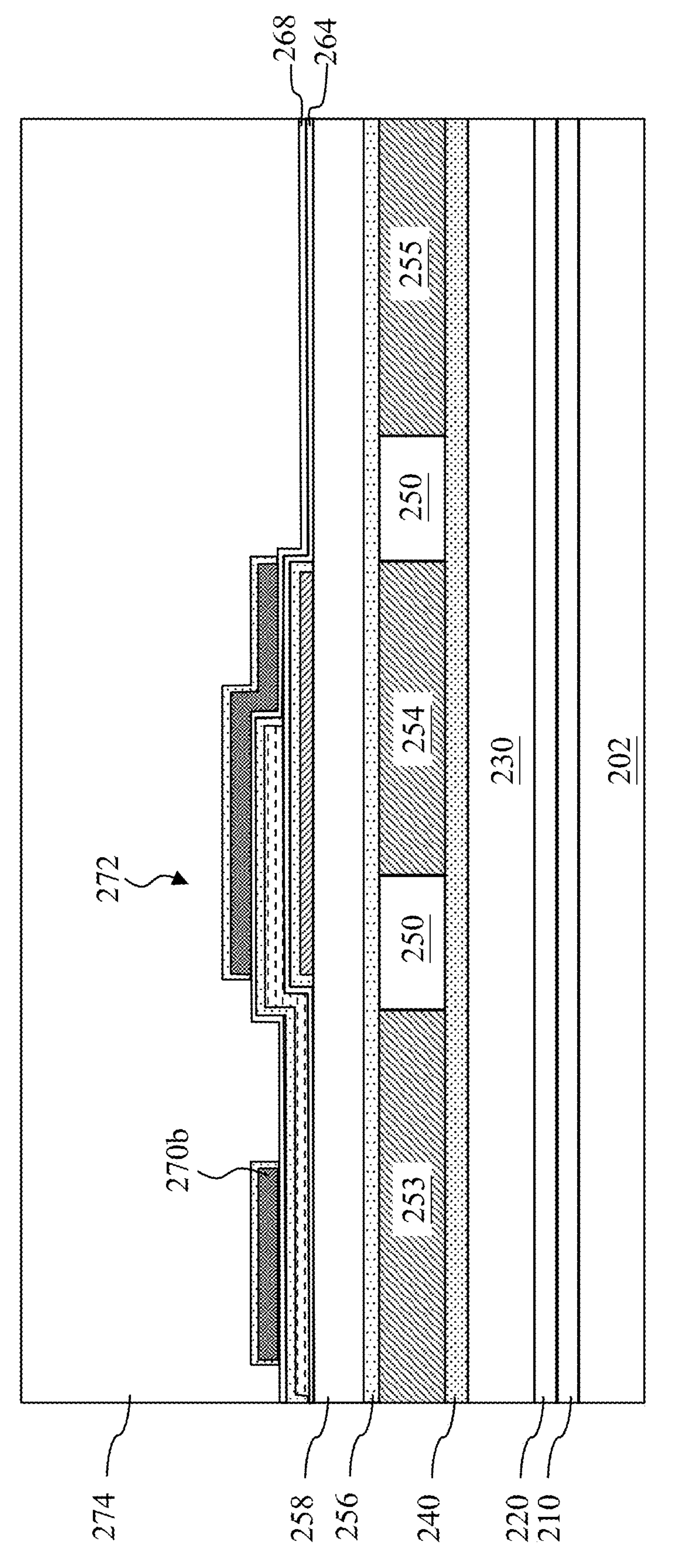

Referring to FIGS. 1 and 10, method 100 includes a block 118 where a first passivation structure 274 is formed over the MIM capacitor 272. As shown in FIG. 10, the MIM capacitor 272 is sandwiched between the first passivation structure 274 and oxide layer 258. In some embodiments, the first passivation structure 274 may include a dielectric layer or two or more dielectric layers formed by any suitable materials such as silicon oxide or silicon nitride. In an embodiment, the first passivation structure 274 includes silicon oxide formed by plasma-enhanced chemical vapor deposition (PECVD). A thickness of the first passivation structure 274 may be between about 5 kÅ and 7 kÅ.

Figure 11:
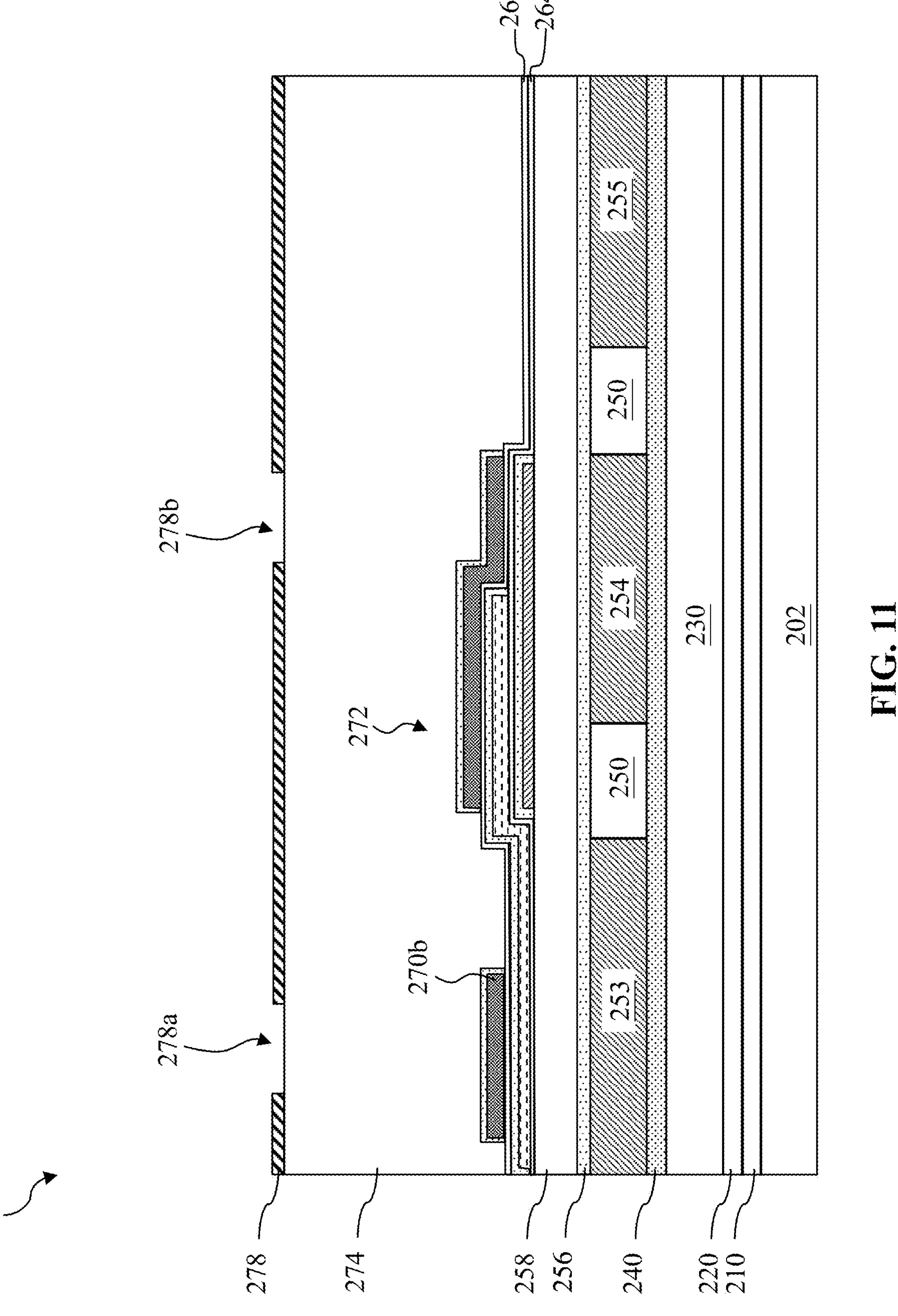

Referring to FIGS. 1, 11, 12, 13, and 14, method 100 includes a block 120 where a conductive via 288 and a conductive via 290 are formed. Reference is first made to FIG. 11. After forming the first passivation structure 274, as shown in FIG. 11, a patterned mask film 278 is formed on the first passivation structure 274. The patterned mask film 278 includes two openings 278*a* and 278*b* exposing portions of the first passivation structure 274 thereunder. For example, the opening 278*a* exposes a portion of the first passivation structure 274 formed directly over the lower contact feature 253, the opening 278*b* exposes a portion of the first passivation structure 274 formed directly over the lower contact feature 254.

Figure 12:
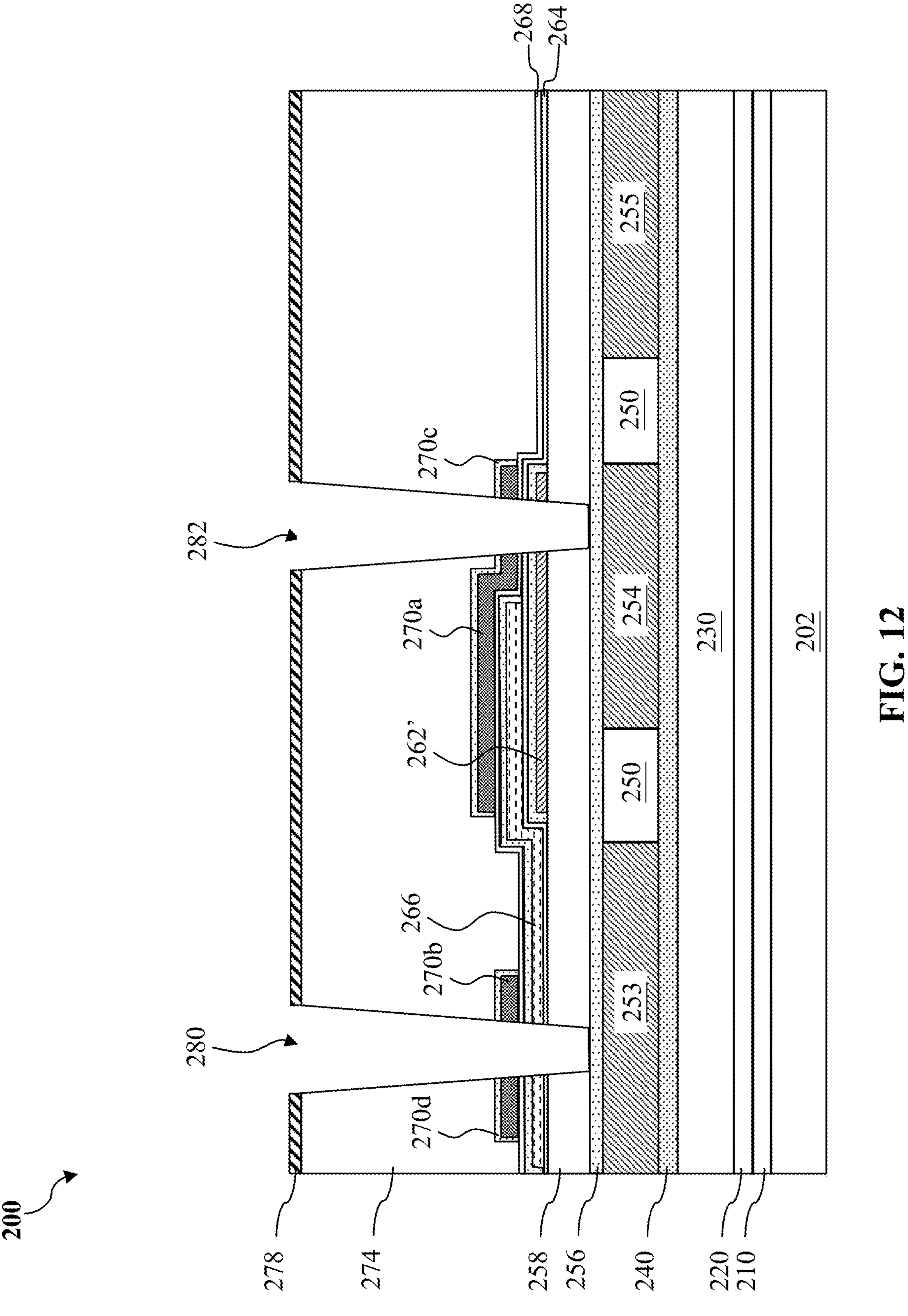

While using the patterned mask film 278 as an etch mask, an etching process may be performed to form an opening 280 and an opening 282, as represented in FIG. 12. The etching process stops at the top surface of the second etch stop layer 256. In an embodiment, the etching process etches through the first passivation structure 274, the nitridated oxide layer 270*d*, the dummy conductive feature 270*b*, the second insulator structure 268, the nitridated oxide layer 267, the second conductor plate 266, and the first insulator structure 264 to form the opening 280. The etching process also etches through the first passivation structure 274, the nitridated oxide layer 270*c*, the third conductor plate 270*a*, the second insulator structure 268, the first insulator structure 264, the nitridated oxide layer 263', and the first conductor plate 262' to form the opening 282. In an embodiment, the etching process may include a dry etching process.

Figure 13:
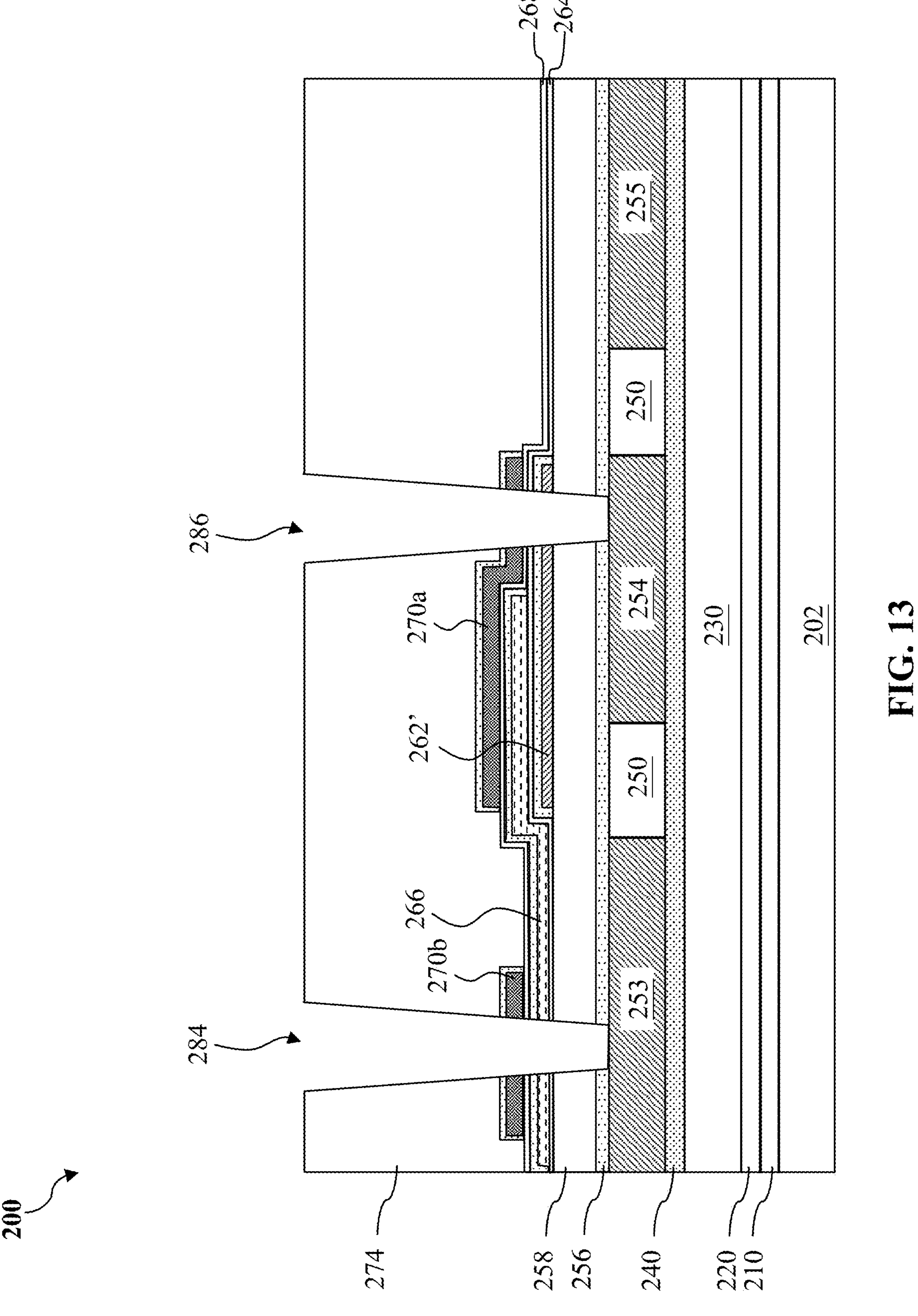

With reference to FIG. 13, after forming the opening 280 and the opening 282, another etching process is performed to vertically extend the opening 280 and the opening 282 to penetrate through the second etch stop layer 256 and expose the lower contact features 253 and 254. The vertically extended openings 280 and 282 may be referred to as opening 284 and opening 286, respectively. In some embodiments, a dry etching process may be used to selectively etch the second etch stop layer 256 to form the opening 284 and opening 286. After forming the opening 284 and opening 286, the patterned mask film 278 may be selectively removed.

Figure 14:
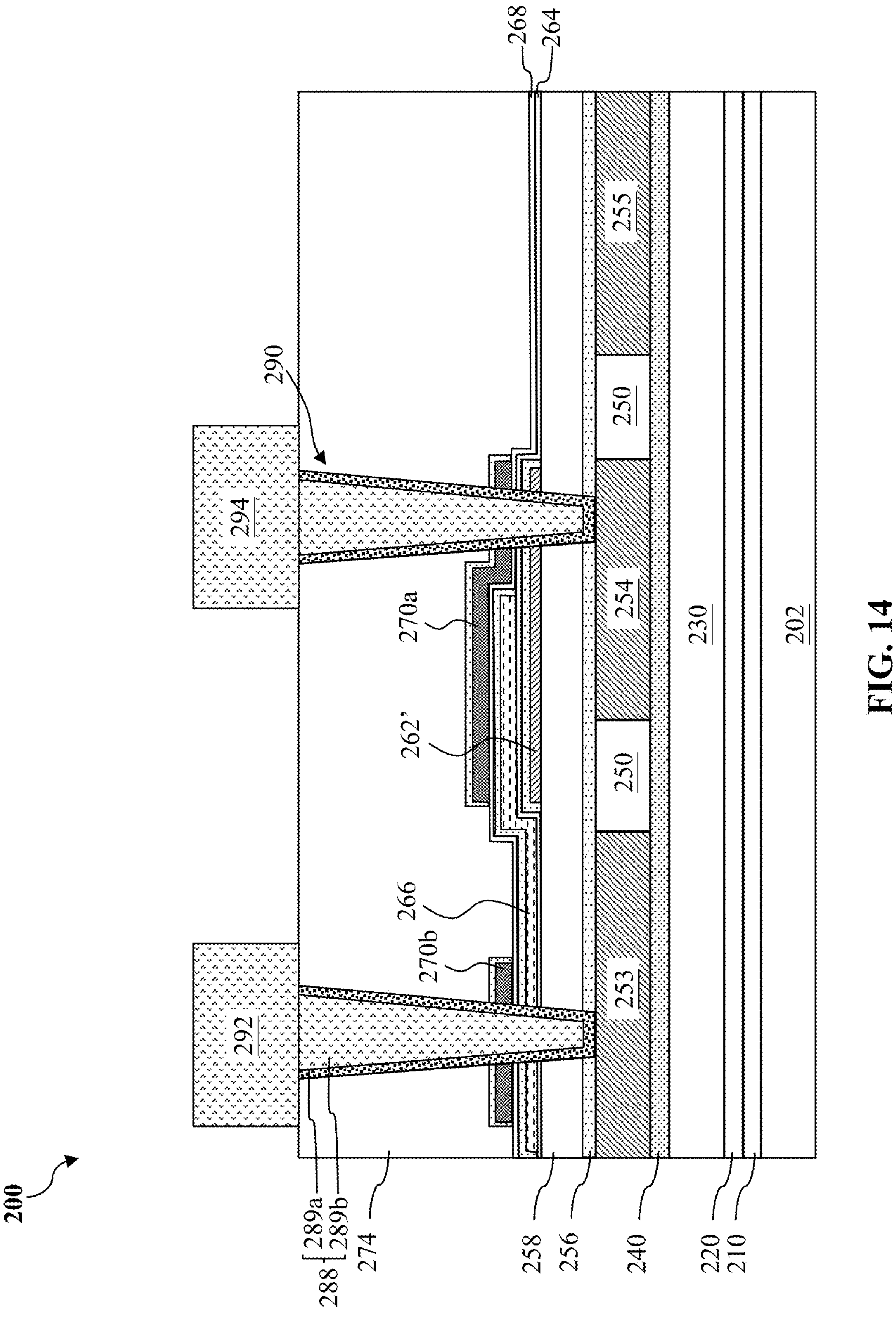

After forming the opening 284 and opening 286, as depicted in FIG. 14, the conductive via 288 and the conductive via 290 are formed in the opening 284 and opening 286, respectively. In the present embodiments, to form the conductive via 288 and the conductive via 290, a barrier layer 289*a* is first conformally deposited over the first passivation structure 274 and into the opening 284 and opening 286 using a suitable deposition technique, such as ALD, PVD or CVD and then a metal fill layer 289*b* is deposited over the barrier layer 289*a* using ALD, PVD, CVD, electroless plating, or electroplating. The barrier layer 289*a* may include titanium nitride (TiN), tantalum nitride (TaN), or another metal nitride. The metal fill layer 289*b* may be formed of copper (Cu), aluminum (Al), aluminum copper (Al-Cu), or other suitable materials. A planarization process (e.g., CMP) may be then performed after forming the metal fill layer 289*b* to finalize the shapes of the conductive via 288 and the conductive via 290.

Figure 15:
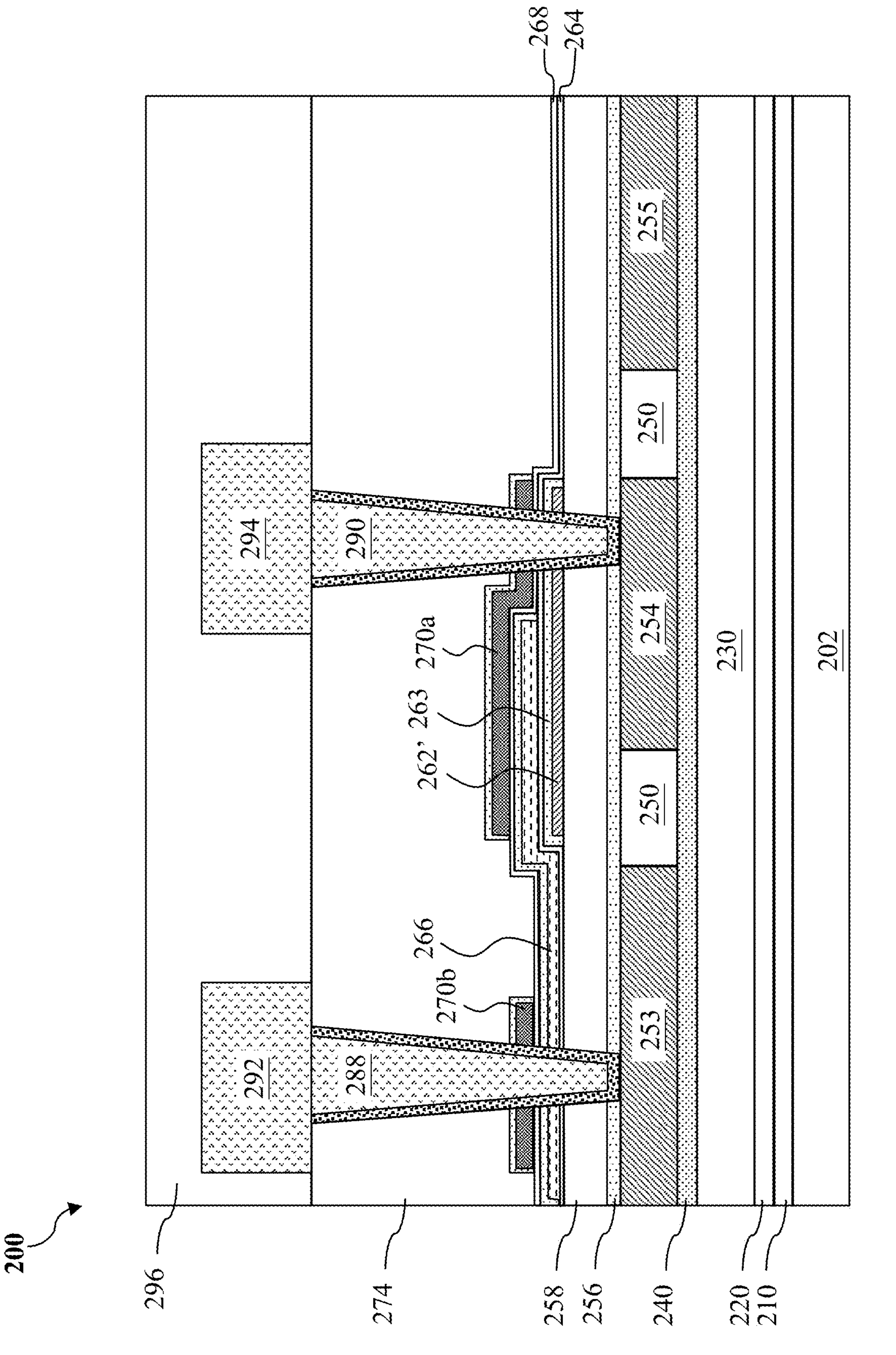

Referring to FIGS. 1, 14 and 15, method 100 includes a block 122 where further processes are performed. Such further processes may include, for example, forming metal lines (e.g., metal lines 292, 294 shown in FIG. 14) over the first passivation structure 274. The metal lines 292 and 294 are electrically connected to and in direct contact with the conductive vias 288 and 290, respectively. In some embodiments, the metal lines 292, 294 may be referred to as upper contact features and may be part of a redistribution layer (RDL) to reroute bond connections between upper and lower layers. Such further processes may also include forming a second passivation structure 296 (shown in FIG. 15) over the workpiece 200. The second passivation structure 296 may be a multi-layer structure. Such further processes may also include formation of openings extending through the second passivation structure 296 to expose the metal lines 292, 294 and forming bonding pad(s) in the openings to electrically connect to the metal lines 292, 294. The bonding pad may include multiple layers, and its formation involves multiple processes. In some embodiments, after the opening is first created to expose the metal lines 292, 294, an under-bump metal (UBM) layer may be deposited into the opening, and then a bump layer (e.g., made of copper) is deposited on the UBM layer. A solder layer may be then formed on the bump layer as a point of connection to external circuitry.

Figures 16, 17, 18:
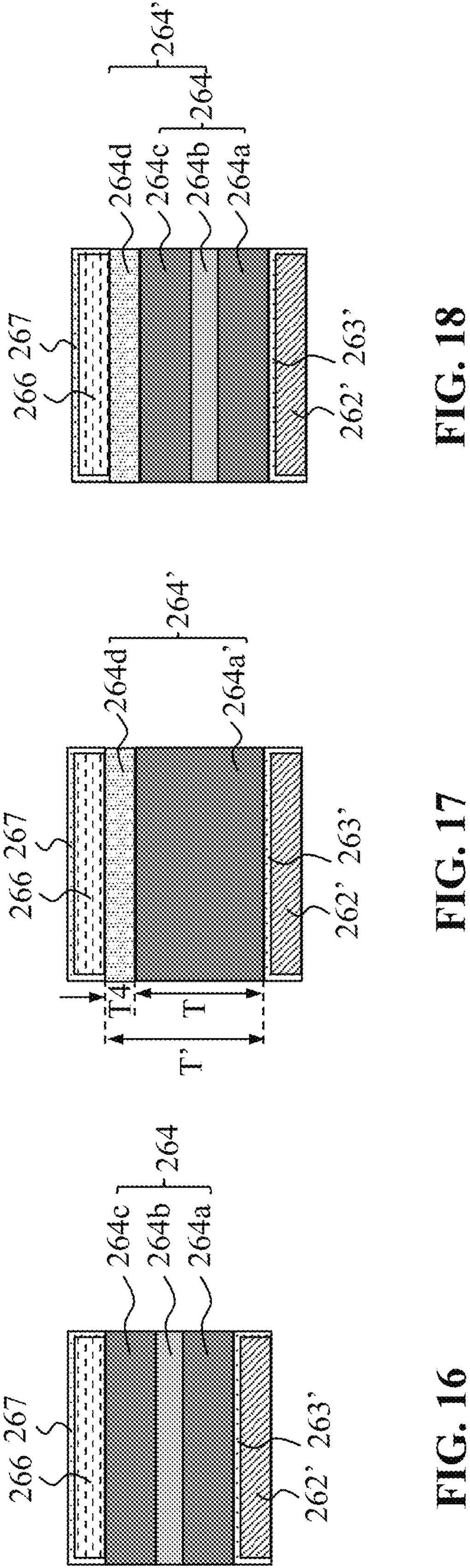
FIGS. 17 and 18 are fragmentary cross-sectional views of alternative workpieces during various fabrication stages in the method of FIG. 1, according to various aspects of the present disclosure.
Figure 19:
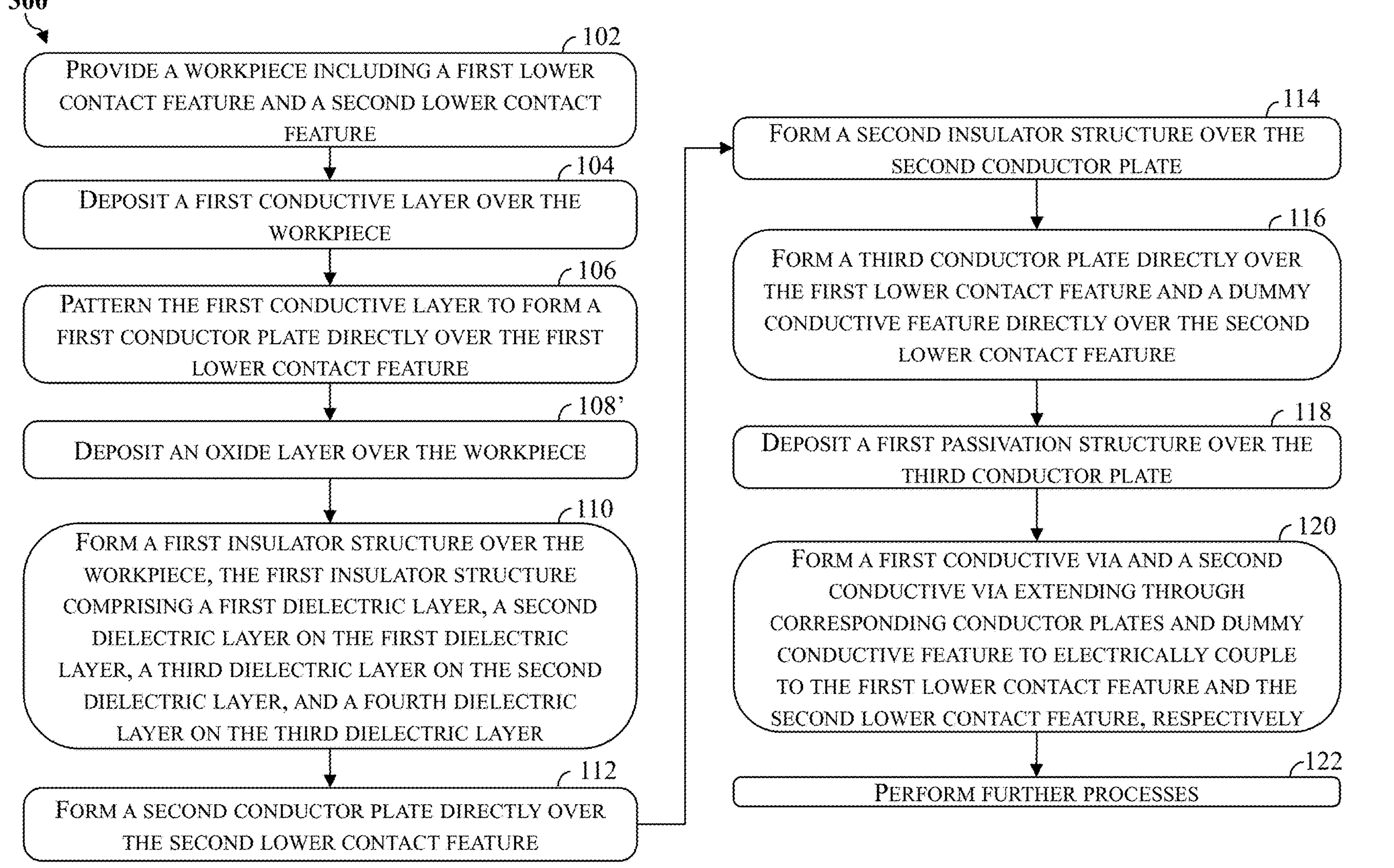
FIG. 19 is a flow chart of a method for fabricating another semiconductor structure, according to various aspects of the present disclosure.

FIG. 16 depicts a fragmentary cross-sectional view of the MIM capacitor 272. More specifically, as depicted in FIG.

16, a fragment of the MIM capacitor 272 includes the first conductor plate 262', the nitridated oxide layer 263' extending along sidewall and top surfaces of the first conductor plate 262', the first high-K dielectric layer 264*a* on and in direct contact with the nitridated oxide layer 263', the second high-K dielectric layer 264*b* on the first high-K dielectric layer 264*a*, the third high-K dielectric layer 264*c* on the second high-K dielectric layer 264*b*, and the second conductor plate 266 on the third high-K dielectric layer 264*c* and overlapped with the first conductor plate 262'. In an embodiment, the first and third high-K dielectric layers 264*a* and 264*c* include HZO, and the second high-K dielectric layer 264*b* includes aluminum oxide ($Al_2O_3$) or titanium oxide ($TiO_2$).

In the above embodiments described with reference to FIGS. 1-16, the TDDB performance of the MIM capacitor 272 is improved by forming the aluminum oxide ($Al_2O_3$)-based or titanium oxide ($TiO_2$)-based second high-K dielectric layer 264*b* between the first and third high-K dielectric layers 264*a* and 264*c*. In alternative embodiments, to increase the forward bias breakdown voltage, the first insulator structure may also include a fourth high-K dielectric layer 264*d*. For example, in embodiments depicted in FIG. 17, a first insulator structure 264' includes a first high-K dielectric layer 264*a'* and a fourth high-K dielectric layer 264*d* formed on the first high-K dielectric layer 264*a'*. The first high-K dielectric layer 264*a'* has the thickness T and is a single layer (shown in FIG. 17) formed of a high-k dielectric material (e.g., HZO). In embodiments depicted in FIG. 18, a first insulator structure 264" includes the first insulator structure 264 and the fourth high-K dielectric layer 264*d* formed on the third high-K dielectric layer 264*c* of the first insulator structure 264. The fourth high-K dielectric layer 264*d* may be deposited by plasma-enhanced ALD (PEALD) at a temperature between 150° C. and 250° C. Forming the fourth high-K dielectric layer 264*d* increases the total thickness of the insulator structure (e.g., the thickness is increased from T to T') disposed between the two adjacent conductor plates (e.g., conductor plates 262' and 266) and thus increases the forward bias breakdown voltage of the MIM capacitor 272. In an embodiment, the second high-K dielectric layer 264*b* includes aluminum oxide ($Al_2O_3$), the fourth high-K dielectric layer 264*d* includes titanium oxide ($TiO_2$). In an embodiment, the second high-K dielectric layer 264*b* includes titanium oxide ($TiO_2$), and the fourth high-K dielectric layer 264*d* also includes titanium oxide ($TiO_2$). Since titanium oxide has a high dielectric permittivity, thus, the introduction of the fourth high-K dielectric layer 264*d* advantageously increases the total thickness of the insulator structure and the forward bias breakdown voltage of the MIM capacitor 272 without decreasing the capacitance of the MIM capacitor 272. In an embodiment, to increase the forward bias breakdown voltage of the MIM capacitor 272 without substantially decreasing the capacitance of the MIM capacitor 272, a thickness T4 of the fourth high-K dielectric layer 264*d* may be between about 1 Å and 10 Å.

Although the embodiments depicted in FIGS. 16-18 are directed to the insulator structure between the first conductor plate 262' and the second conductor plate 266, it is understood that those embodiments are also applicable to the insulator structure between the second conductor plate 266 and the third conductor plate 270*a* or any other two adjacent conductor plates. A composition of the second insulator structure may be the same as or different from a composition of the first insulator structure. In some embodiments, the second insulator structure 268 may also include a titanium oxide layer formed on the third high-K dielectric layer 268*c*. In an alternative embodiment, the first insulator structure 264 may include the titanium oxide layer 264*d*, and the second insulator structure 268 may be free of the titanium oxide layer, and a thickness (e.g., thickness T') of the second insulator structure 268 is less than a thickness (e.g., thickness T) of the first insulator structure 264.

Figure 20:
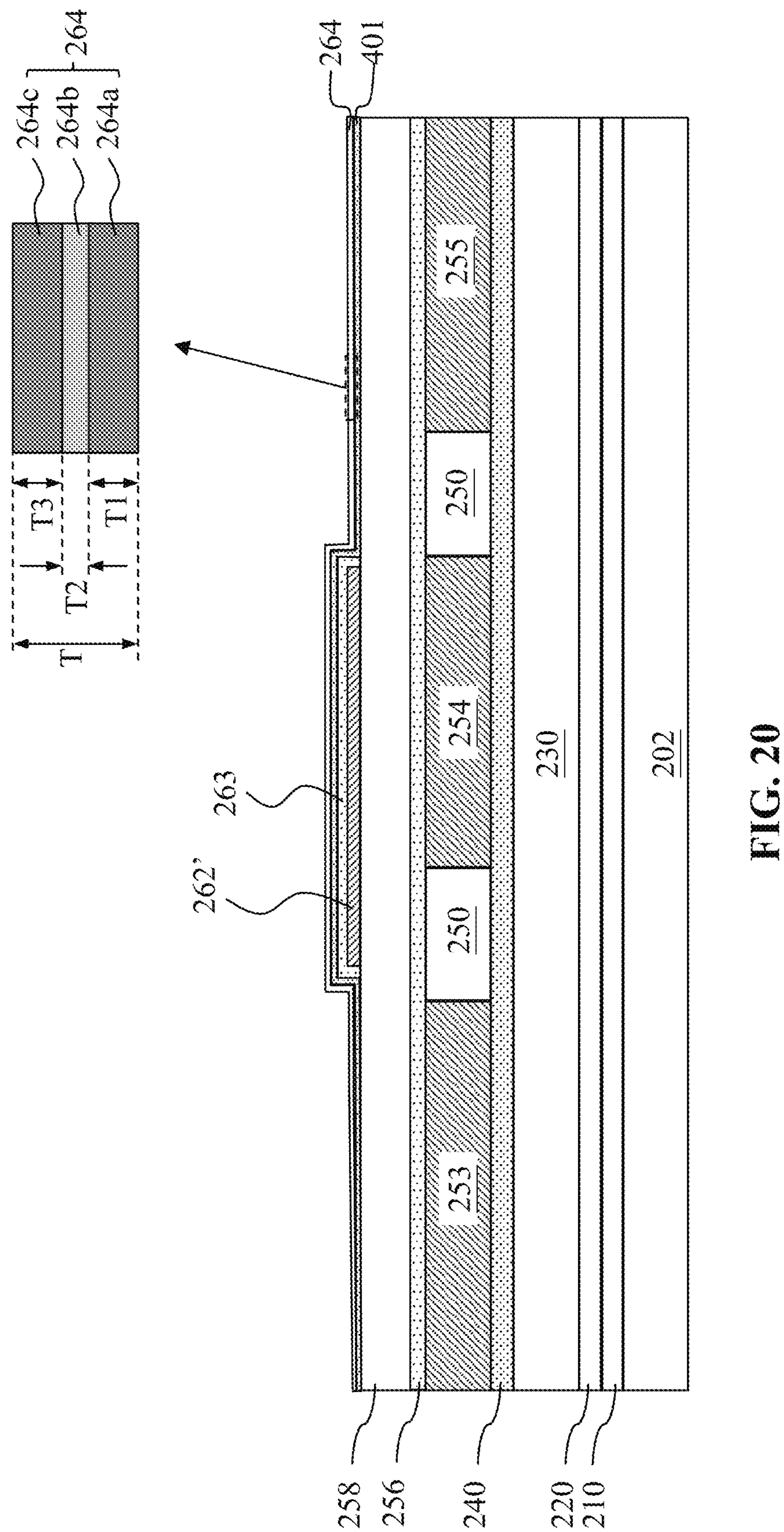
FIGS. 20, 21, and 22 are fragmentary cross-sectional views of a workpiece during various fabrication stages in the method of FIG. 19, according to various aspects of the present disclosure.
Figure 21:
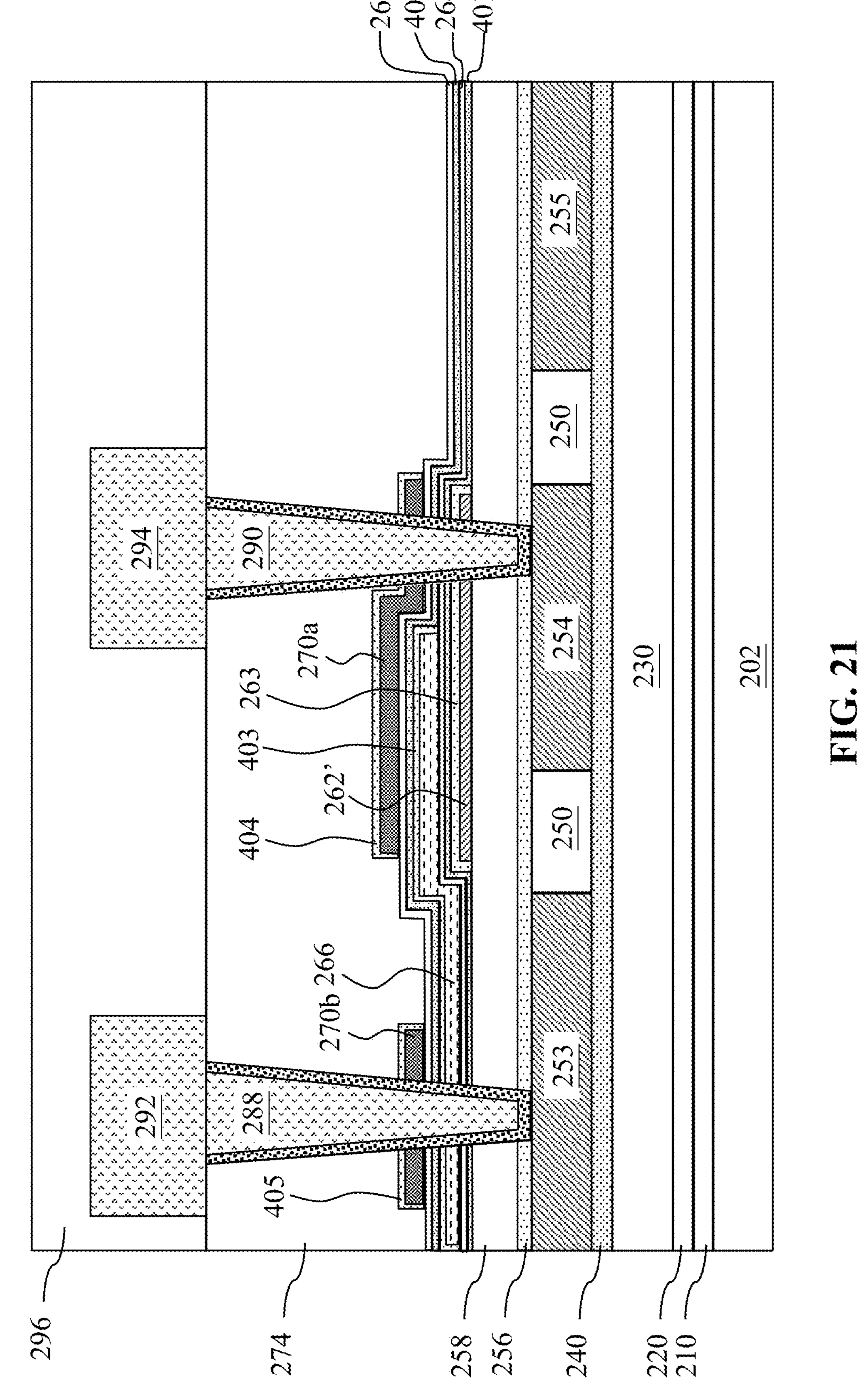

In the above embodiments described with reference to FIGS. 1-18, nitridation process (e.g., the nitridation process 265) is performed after the formation of the first conductor plate, the second conductor plate, and/or the third conductor plate. FIG. 19 depicts an alternative method 300 of forming a MIM capacitor. The method 300 is similar to the method 100. One of the differences between the method 100 and method 300 includes replacing the nitridation process (e.g., the nitridation process in block 108) with an ALD process. More specifically, as depicted in FIG. 20, after forming the first conductor plate 262' and the formation of the oxide layer 263 (e.g., $TiO_2$) in block 106, the method 300 proceeds to block 108' where another oxide layer 401 is deposited over a workpiece 200' before forming the first insulator structure 264. In an embodiment, the oxide layer 401 includes titanium oxide ($TiO_2$) and is formed by ALD. That is, a composition of the oxide layer 401 is the same as a composition of the oxide layer 263. The oxide layer 401 has higher uniformity, better morphology, and less defects than the oxide layer 263. After the formation of the oxide layer 401, operations in blocks 110-122 may be performed to finish the fabrication of the workpiece 200'. The workpiece 200' in FIG. 20 is similar to the workpiece 200 in FIG. 15, one of the differences between the workpiece 200' and the workpiece 200 includes that the workpiece 200' doesn't have the nitridated oxide layer(s) (e.g., TiON), instead, the workpiece 200' includes the oxide layer 263 extending along sidewall and top surfaces of the first conductor plate 262' and a conformal oxide layer 401 (e.g., $TiO_2$) formed on the oxide layer 263 and the oxide layer 258. Similarly, the workpiece 200' may also include oxide layers 403, 404, and 405 formed along with the formation of the conductor plates 266 and 270*a* and the dummy conductive feature 270*b*, respectively, and a conformal oxide layer 402 (e.g., $TiO_2$) formed by ALD. The conformal oxide layer 402 is similar to the conformal oxide layer 401.

Figure 22:
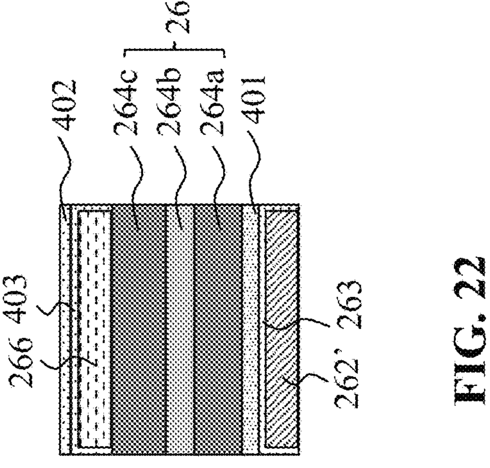

FIG. 22 depicts a fragmentary cross-sectional view of the MIM capacitor 272 in the workpiece 200'. More specifically, as depicted in FIG. 22, the workpiece 200' includes the first conductor plate 262', the oxide layer 263 extending along sidewall and top surfaces of the first conductor plate 262', the oxide layer 401 on and in direct contact with the oxide layer 263, the first high-K dielectric layer 264*a* on and in direct contact with the oxide layer 401, the second high-K dielectric layer 264*b* on the first high-K dielectric layer 264*a*, the third high-K dielectric layer 264*c* on the second high-K dielectric layer 264*b*, and the second conductor plate 266 on the third high-K dielectric layer 264*c* and overlapped with the first conductor plate 262'. In an embodiment, the first and third high-K dielectric layers 264*a* and 264*c* include HZO, and the second high-K dielectric layer 264*b* includes aluminum oxide ($Al_2O_3$) or titanium oxide ($TiO_2$).

Figure 24:
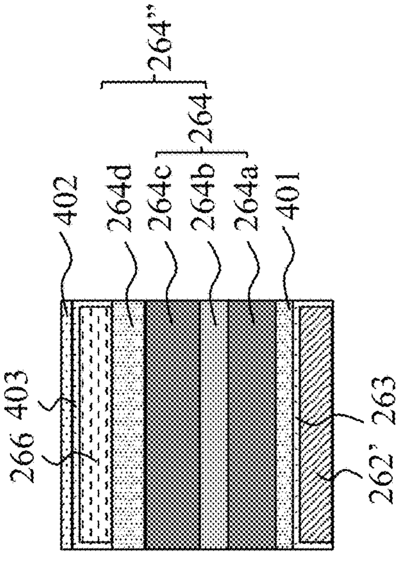
FIGS. 23 and 24 are fragmentary cross-sectional views of alternative workpieces during various fabrication stages in the method of FIG. 19, according to various aspects of the present disclosure.
Figure 23:
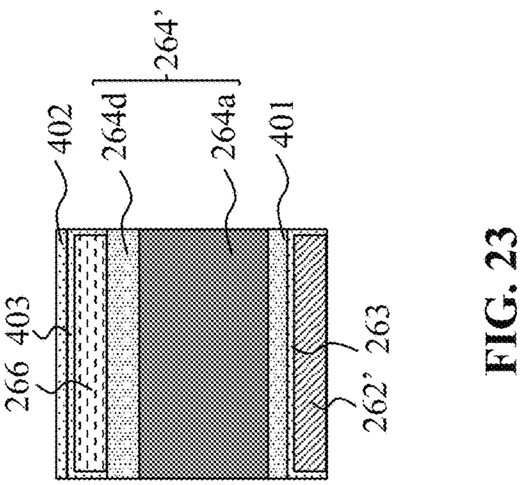

The methods of improving the forward bias breakdown voltage (e.g., forming a titanium oxide layer on the first and/or the second insulator structure 264/264'/268) may be also applied to the workpiece 200' to increase the forward bias breakdown voltage of the workpiece 200'. For example, in embodiments depicted in FIG. 23, the first insulator structure 264' including the first high-K dielectric layer 264*a'* and the fourth high-K dielectric layer 264*d* is formed on the oxide layer 401. In embodiments depicted in FIG. 24, the first insulator structure 264" including the first insulator structure 264 and the fourth high-K dielectric layer **264*d* is formed on the oxide layer 401. In an embodiment, the oxide layer 401 and the fourth high-K dielectric layer 264*d* both include titanium oxide ($TiO_2$), and the second high-K dielectric layer 264*b* includes aluminum oxide ($Al_2O_3$) or titanium oxide ($TiO_2$). For similar reasons described above with reference to FIGS. 16-18, the forward bias breakdown voltage of the workpiece 200' may be advantageously increased. Although the embodiments depicted in FIGS. 22-24 are directed to the first insulator structure between the first conductor plate 262' and the second conductor plate 266, it is understood that those embodiments are also applicable to the insulator structure between the second conductor plate 266 and the third conductor plate 270*a*** or any other two adjacent conductor plates.

Although not intended to be limiting, one or more embodiments of the present disclosure provide many benefits to a semiconductor structure and the formation thereof. For example, the present disclosure provides multi-layer insulator structures disposed between two adjacent conductor plates of metal-insulator-metal capacitors. In the present embodiments, by providing the multi-layer insulator structures, TDDB performance of the metal-insulator-metal capacitors may be improved. In some embodiments, forward bias breakdown voltage of the metal-insulator-metal capacitor may also be increased. Thus, the overall performance and reliability of the metal-insulator-metal capacitors may be advantageously improved.

The present disclosure provides for many different embodiments. Semiconductor structures and methods of fabrication thereof are disclosed herein. In one exemplary aspect, the present disclosure is directed to a method. The method includes depositing a first conductive material layer over a substrate, patterning the first conductive material layer to form a first conductor plate over the substrate, forming a first high-K dielectric layer over the first conductor plate, forming a second high-K dielectric layer on the first high-K dielectric layer, forming a third high-K dielectric layer on the second high-K dielectric layer, and forming a second conductor plate over the third high-K dielectric layer and vertically overlapped with the first conductor plate, where a composition of the first high-K dielectric layer is the same as a composition of the third high-K dielectric layer and is different from a composition of the second high-K dielectric layer.

In some embodiments, the first high-K dielectric layer and the third high-K dielectric layer may include hafnium zirconium oxide (HZO). In some embodiments, the second high-K dielectric layer may include aluminum oxide ($Al_2O_3$) or titanium oxide ($TiO_2$). In some embodiments, the patterning of the first conductive material layer y include performing an etching process to the first conductive material layer, where the performing of the etching process further oxidizes sidewall and top surfaces of the first conductor plate to form an oxide layer. In some embodiments, the method may also include, before the forming of the first high-K dielectric layer, performing a nitridation process to the oxide layer, thereby forming a nitride oxide layer on the first conductor plate. In some embodiments, after the performing of the nitridation process, a nitrogen content in an upper portion of the first conductor plate is greater than a nitrogen content in a lower portion of the first conductor plate. In some embodiments, the method may also include forming a fourth high-K dielectric layer on the third high-K dielectric layer, wherein a composition of the fourth high-K dielectric layer is different from the composition of the first high-K dielectric layer. In some embodiments, the composition of the fourth high-K dielectric layer may be the same as the composition of the second high-K dielectric layer. In some embodiments, a thickness of the third high-K dielectric layer may be substantially equal to a thickness of the first high-K dielectric layer.

In another exemplary aspect, the present disclosure is directed to a method. The method includes forming a first conductor plate on a first insulation layer over a substrate, forming a second insulation layer extending along top and sidewall surfaces of the first conductor plate, conformally forming a multi-layer dielectric structure over the first conductor plate, where the multi-layer dielectric structure is in direct contact with both the first insulation layer and the second insulation layer, and the multi-layer dielectric structure is formed of high-K dielectric layers, and forming a second conductor plate over the multi-layer dielectric structure and vertically overlapped with the first conductor plate.

In some embodiments, the conformally forming of the multi-layer dielectric structure may include conformally depositing a first high-K dielectric layer over the first conductor plate, wherein the first high-K dielectric layer is in direct contact with both the first insulation layer and the second insulation layer, conformally depositing a second high-K dielectric layer on the first high-K dielectric layer, and conformally depositing a third high-K dielectric layer on the second high-K dielectric layer, where a composition of the second high-K dielectric layer is different from a composition of the first high-K dielectric layer and a composition of the third high-K dielectric layer. In some embodiments, the conformally forming of the multi-layer dielectric structure may include conformally depositing a fourth high-K dielectric layer on the third high-K dielectric layer, where a composition of the fourth high-K dielectric layer is different from the composition of the first high-K dielectric layer and the composition of the third high-K dielectric layer. In some embodiments, the composition of the fourth high-K dielectric layer may be the same as the composition of the second high-K dielectric layer. In some embodiments, the forming of the first conductor plate may include depositing a conductive material layer on the first insulation layer, and performing an etching process to pattern the conductive material layer to form the first conductor plate, wherein the performing of the etching process further oxidizes sidewall and top surfaces of the first conductor plate to form the second insulation layer. In some embodiments, the method may also include, after the performing of the etching process, performing a nitration plasma treatment to the second insulation layer. In some embodiments, the method may also include, after the performing of the etching process, conformally depositing a dielectric layer over the first insulation layer, where a composition of the dielectric layer is the same as a composition of the second insulation layer.

In yet another exemplary aspect, the present disclosure is directed to a semiconductor structure. The semiconductor structure includes a metal-insulator-metal (MIM) capacitor on a first insulation layer over a substrate, the MIM capacitor comprising: a first conductor plate on the first insulation layer, a second insulation layer extending along and on sidewall and top surfaces of the first conductor plate, a conformal dielectric structure over the substrate and the first conductor plate, where the conformal dielectric structure is formed of multiple high-K dielectric layers, and a second conductor plate over the conformal dielectric structure and vertically overlapped with the first conductor plate, where the first conformal dielectric structure is in direct contact with both the second insulation layer and the first insulation layer.

In some embodiments, the conformal dielectric structure may include a first hafnium-zirconium oxide layer over the second insulation layer, an aluminum oxide layer on the first hafnium-zirconium oxide layer, and a second hafnium-zirconium oxide layer on the aluminum oxide layer, where a thickness of the first hafnium-zirconium oxide layer is substantially equal to a thickness of the second hafnium-zirconium oxide layer. In some embodiments, the first conductor plate may include titanium nitride (TiN), and the second insulation layer comprises titanium oxynitride (TiON). In some embodiments, a nitrogen content in an upper portion of the first conductor plate may be greater than a nitrogen content in a lower portion of the first conductor plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

depositing a first conductive material layer over a substrate;

patterning the first conductive material layer to form a first conductor plate over the substrate, wherein the patterning of the first conductive material layer comprises performing an etching process to the first conductive material layer, and the performing of the etching process further oxidizes sidewall and top surfaces of the first conductor plate to form an oxide layer;

performing a nitridation process to the oxide layer;

forming a first high-K dielectric layer over the first conductor plate;

forming a second high-K dielectric layer on the first high-K dielectric layer;

forming a third high-K dielectric layer on the second high-K dielectric layer; and forming a second conductor plate over the third high-K dielectric layer and vertically overlapped with the first conductor plate, wherein a composition of the first high-K dielectric layer is the same as a composition of the third high-K dielectric layer and is different from a composition of the second high-K dielectric layer.

2. The method of claim 1, wherein the first high-K dielectric layer and the third high-K dielectric layer comprises hafnium zirconium oxide (HZO).

3. The method of claim 2, wherein the second high-K dielectric layer comprises aluminum oxide ($Al_2O_3$) or titanium oxide ($TiO_2$).

4. The method of claim 1, wherein the performing of the nitridation process converts the oxide layer into a nitride oxide layer on the first conductor plate.

5. The method of claim 4, wherein, after the performing of the nitridation process, a nitrogen content in an upper portion of the first conductor plate is greater than a nitrogen content in a lower portion of the first conductor plate.

6. The method of claim 1, further comprising:

forming a fourth high-K dielectric layer on the third high-K dielectric layer, wherein a composition of the fourth high-K dielectric layer is different from the composition of the first high-K dielectric layer.

7. The method of claim 6, wherein the composition of the fourth high-K dielectric layer is the same as the composition of the second high-K dielectric layer.

8. The method of claim 1, wherein a thickness of the third high-K dielectric layer is substantially equal to a thickness of the first high-K dielectric layer.

9. The method of claim 1, wherein the first conductive material layer comprises titanium nitride, and the oxide layer comprises titanium oxide.

10. A method, comprising:

forming a first conductor plate on a first insulation layer over a substrate;

forming a second insulation layer extending along top and sidewall surfaces of the first conductor plate, wherein the first conductor plate spans a first width, the second insulation layer spans a second width greater than the first width;

conformally forming a multi-layer dielectric structure over the first conductor plate, wherein the multi-layer dielectric structure extends contiguously on the first insulation layer and the second insulation layer, and wherein the multi-layer dielectric structure is formed of high-K dielectric layers; and forming a second conductor plate over the multi-layer dielectric structure and vertically overlapped with the first conductor plate.

11. The method of claim 10, wherein the conformally forming of the multi-layer dielectric structure comprises:

conformally depositing a first high-K dielectric layer over the first conductor plate, wherein the first high-K dielectric layer is in direct contact with both the first insulation layer and the second insulation layer;

conformally depositing a second high-K dielectric layer on the first high-K dielectric layer; and conformally depositing a third high-K dielectric layer on the second high-K dielectric layer, wherein a composition of the second high-K dielectric layer is different from a composition of the first high-K dielectric layer and a composition of the third high-K dielectric layer.

12. The method of claim 11, wherein the conformally forming of the multi-layer dielectric structure further comprises:

conformally depositing a fourth high-K dielectric layer on the third high-K dielectric layer, wherein a composition of the fourth high-K dielectric layer is different from the composition of the first high-K dielectric layer and the composition of the third high-K dielectric layer.

13. The method of claim 12, wherein the composition of the fourth high-K dielectric layer is the same as the composition of the second high-K dielectric layer.

14. The method of claim 10, wherein the forming of the first conductor plate comprises:

depositing a conductive material layer on the first insulation layer; and performing an etching process to pattern the conductive material layer to form the first conductor plate, wherein the performing of the etching process further oxidizes sidewall and top surfaces of the first conductor plate to form the second insulation layer.

15. The method of claim 14, further comprising: after the performing of the etching process, performing a nitration plasma treatment to the second insulation layer.

16. The method of claim 14, further comprising: after the performing of the etching process, conformally depositing a dielectric layer over the multi-layer dielectric structure, wherein a composition of the dielectric layer is the same as a composition of the second insulation layer.

17. A method, comprising:

forming a first conductor plate over a substrate, the first conductor plate extending over a first lower contact feature in the substrate;

forming an oxide layer on the first conductor plate;

depositing a multi-layer structure formed of high-k dielectric materials over the oxide layer;

forming a second conductor plate extending on the multi-layer structure, the second conductor plate extending over a second lower contact feature in the substrate;

forming a first via extending through the first conductor plate to couple to the first lower contact feature; and forming a second via extending through the multi-layer structure and the second conductor plate to couple to the second lower contact feature, wherein the second via is physically separated from the oxide layer.

18. The method of claim 17, wherein the oxide layer comprises titanium oxide, and the first conductor plate comprises titanium nitride.

19. The method of claim 17, wherein a nitrogen content of the first conductor plate is non-uniform.

20. The method of claim 17, wherein the multi-layer structure comprises a first dielectric layer formed of hafnium zirconium oxide (HZO) and a second dielectric layer over the first dielectric layer and formed of aluminum oxide ($Al_2O_3$).

* * * * *